United States Patent
Asaka

(10) Patent No.: US 7,613,971 B2
(45) Date of Patent: Nov. 3, 2009

(54) SEMICONDUCTOR INTEGRATED CIRCUIT WITH DELAY TEST CIRCUIT, AND METHOD FOR TESTING SEMICONDUCTOR INTEGRATED CIRCUIT

(75) Inventor: Toshiharu Asaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 339 days.

(21) Appl. No.: 11/348,414

(22) Filed: Feb. 7, 2006

(65) Prior Publication Data
US 2006/0179376 A1 Aug. 10, 2006

(30) Foreign Application Priority Data
Feb. 8, 2005 (JP) ............... 2005-032287

(51) Int. Cl.
*G01R 31/28* (2006.01)
(52) U.S. Cl. .............. 714/731; 714/25; 714/30; 714/724; 714/726; 714/727; 714/729; 714/741
(58) Field of Classification Search .......... None
See application file for complete search history.

(56) References Cited

U.S. PATENT DOCUMENTS

| | | | | |
|---|---|---|---|---|
| 6,954,887 B2* | 10/2005 | Wang et al. | ........ | 714/729 |
| 7,194,669 B2* | 3/2007 | Nadeau-Dostie | ........ | 714/726 |
| 2002/0124218 A1* | 9/2002 | Kishimoto | ........ | 714/738 |
| 2004/0153926 A1* | 8/2004 | Abdel-Hafez et al. | ....... | 714/726 |
| 2004/0163021 A1* | 8/2004 | Nadeau-Dostie | ........ | 714/726 |
| 2005/0240847 A1* | 10/2005 | Nadeau-Dostie et al. | ..... | 714/726 |
| 2005/0262409 A1* | 11/2005 | Wang et al. | ........ | 714/738 |
| 2006/0064616 A1* | 3/2006 | Rajski et al. | ........ | 714/726 |
| 2007/0283201 A1* | 12/2007 | Grise et al. | ........ | 714/724 |

FOREIGN PATENT DOCUMENTS

JP 2002-196046 A 7/2002

OTHER PUBLICATIONS

Sato, Y., et al., "DFT Timing Design Methodology for At-Speed BIST", Proceedings of the ASP-DAC 2003, pp. 763-768 (Jan. 21-24, 2003).

* cited by examiner

*Primary Examiner*—John P Trimmings
(74) *Attorney, Agent, or Firm*—Foley & Lardner LLP

(57) ABSTRACT

A semiconductor integrated circuit includes an input side flip-flop; a combinational circuit having an input connected with the input side flip-flop; an output side flip-flop connected with an output of the combinational circuit; and a delay test circuit. The delay test circuit generates output clock pulses by removing an optional one from equal to or more than 3 continuing clock pulses of an input clock signal, and supplies the output clock pulse to the input side flip-flop and the output side flip-flop.

12 Claims, 16 Drawing Sheets

Fig. 10A  PLL CLOCK SIGNAL 20

Fig. 10B  SCAN ENABLE SIGNAL 51

Fig. 10C  OUTPUT OF DELAY TEST CIRCUIT 10 (OUTPUT CLOCK SIGNAL)

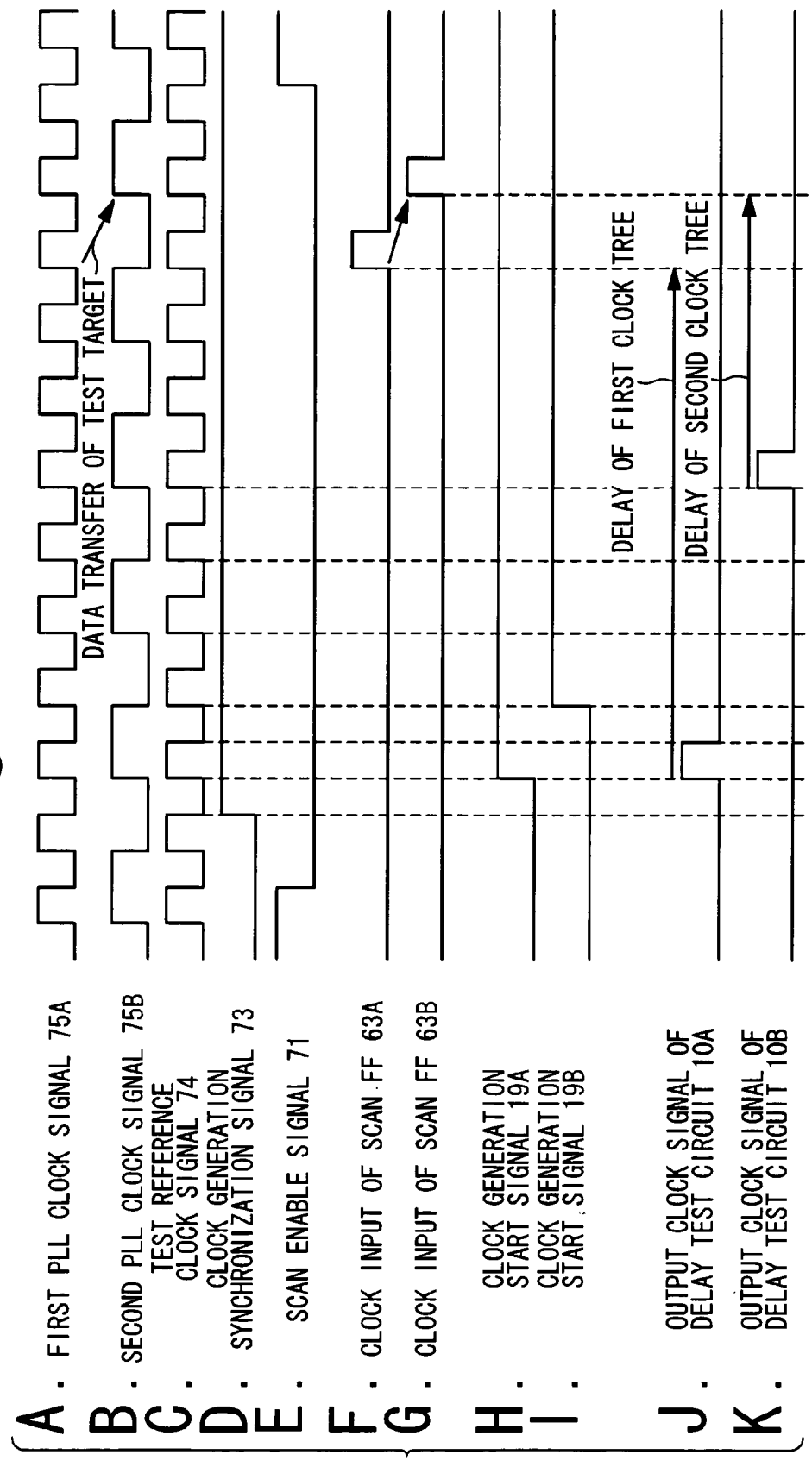

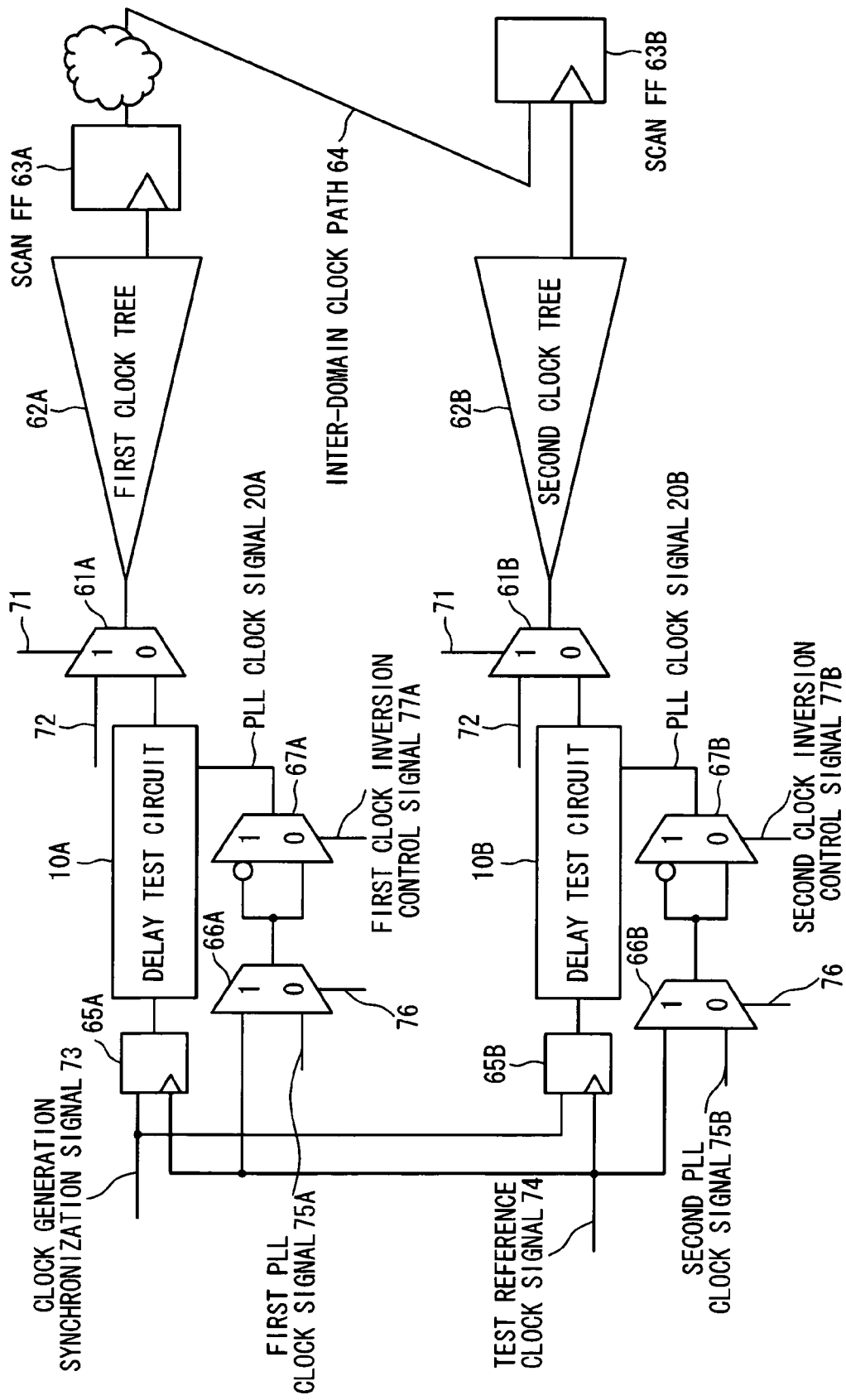

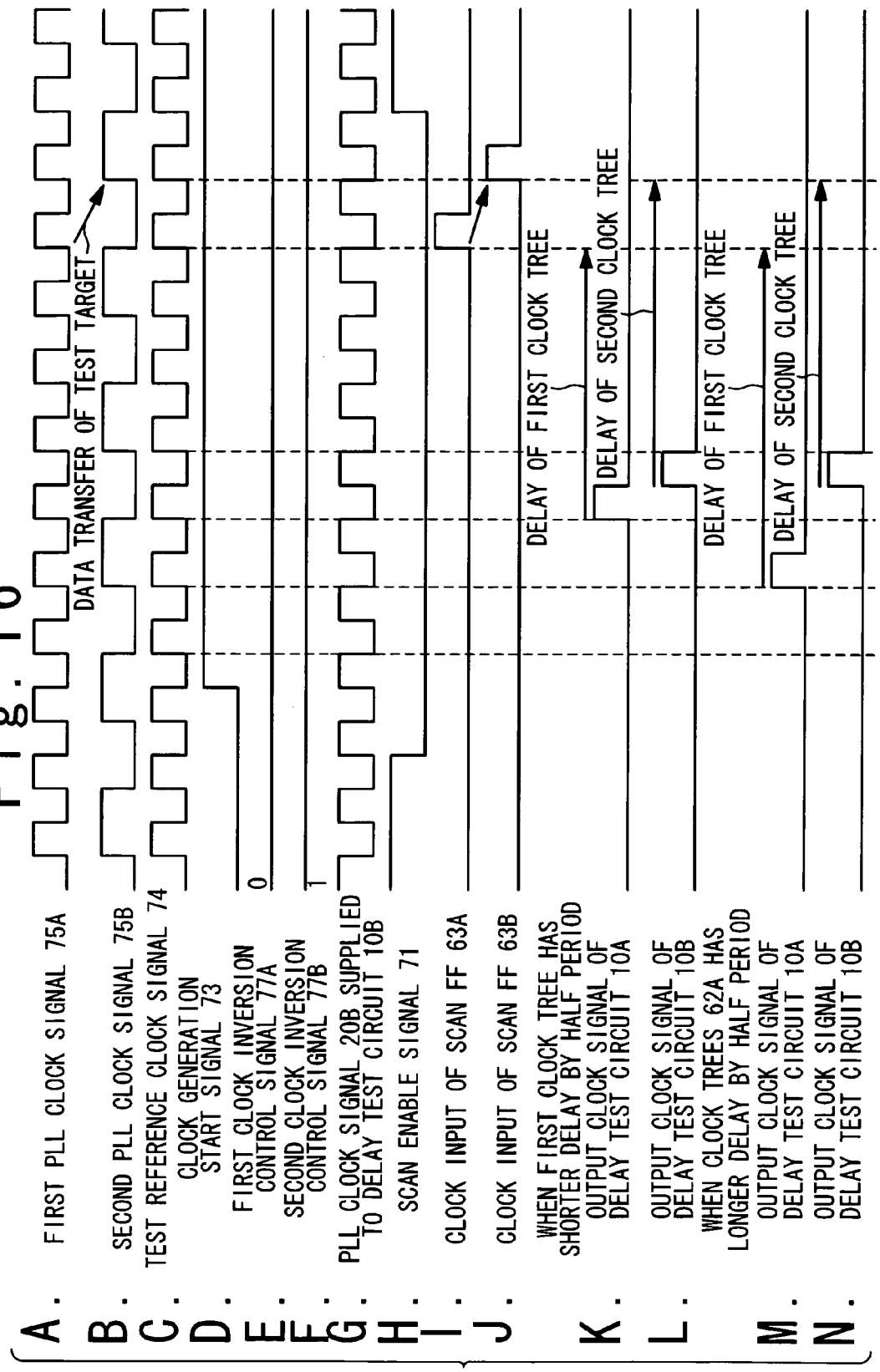

2

SEMICONDUCTOR INTEGRATED CIRCUIT WITH DELAY TEST CIRCUIT, AND METHOD FOR TESTING SEMICONDUCTOR INTEGRATED CIRCUIT

BACKGROUND OF THE INVENTION

1. Field of the Invention

The present invention relates to a semiconductor integrated circuit with a delay test circuit, and a method for testing the semiconductor integrated circuit. More specifically, the present invention relates to a technique for facilitating a test of a semiconductor integrated circuit using a scan path.

2. Description of the Related Art

One of the most widely used techniques for facilitating a test of a semiconductor integrated circuit is a scan design technique for incorporating scan paths into the semiconductor integrated circuit. Specifically, the flip-flops of a core logic are connected in series to form the scan path, and a selector is additionally provided for a data input of each of flip-flops. The flip-flops are often referred to as "scan flip-flops". This scan path functions as a very large scale of shift register. At the time of testing the core logic, a data is directly written into or read from the scan flip-flops using the scan path so as to test operations of the core logic.

One of the important points of the test is to use the scan path to realize an at-speed delay test, in other words, is to use the scan path to realize a delay test at a same operating rate as a normal operating rate when the semiconductor integrated circuit. This is because a fault that inappropriate delay is caused in the semiconductor integrated circuit may be present in the circuit despite a logically correct circuit configuration. Such a fault needs to be detected by so-called at-speed delay test.

It is a restriction on an operating rate of an LSI tester that makes it difficult to carry out the at-speed delay test. For the reason of recent improvement in the operating rate of the semiconductor integrated circuit, the LSI tester needs to have a high operating rate for the at-speed delay test. However, the use of the LSI tester having the high operating rate pushes up a test cost and is disadvantageous against a manufacturing cost of the semiconductor integrated circuit.

A technique is known in which the at-speed delay test is used with a tester of relatively low operating rate by incorporating a PLL circuit into a target semiconductor integrated circuit to generate a clock signal. By incorporating the PLL circuit into the semiconductor integrated circuit, it is unnecessary to supply a high frequency clock signal from the tester to the target semiconductor integrated circuit. Thus, it becomes possible to carry out the at-speed delay test by using the tester having a relatively low operating rate.

For instance, a semiconductor integrated circuit is disclosed in Japanese Laid Open Patent Application (JP-P2002-196046A), which includes a PLL circuit configured to continuously output a desired number of clock pulses in response to an external control signal. More specifically, the PLL circuit includes a PLL oscillator to generate a clock signal having a frequency corresponding to a same operating rate as a normal operating rate of the semiconductor integrated circuit, and a counter to count up in synchronization with the clock signal. When a counter value of the counter is greater than l and smaller than m (where l and m are natural numbers that satisfy l<m), the PLL circuit outputs the clock signal without masking it. Otherwise, the PLL circuit outputs a masked clock signal. By employing such a configuration, (m−l−1) continuous clock pulses can be taken out from the clock signal generated by the PLL oscillator, as shown in FIG. 1. It should be noted that "output of the n continuous clock pulses" means that clock pulses are continuously outputted over n clock cycles. When the at-speed delay test is carried out, these continuous clock pulses are supplied to an internal circuit.

A typical procedure of the at-speed delay test to the semiconductor integrated circuit will now be described with reference to an instance in which a target semiconductor integrated circuit is configured as shown in FIG. 2. The semiconductor integrated circuit shown in FIG. 2 includes scan flip-flops 101, 103, 105, and 107, and combinational circuits 102, 104, and 106. The scan flip-flops 101, 103, 105, and 107 are connected in series to constitute a scan path 108. Also, the combinational circuit 102 is connected with the scan flip-flops 101 and 103, the combinational circuit 104 is connected with the scan flip-flops 103 and 105, and the combinational circuit 106 is connected with the scan flip-flops 105 and 107. For simplification of the description, it is assumed that each of the combinational circuits 102, 104, and 106 is a single cycle path, that is, the combinational circuit is designed to transmit data in a single clock cycle. Most of the combinational circuits integrated into the semiconductor integrated circuit are single cycle paths. The procedure for the delay test carried out to the combinational circuit 106 in the semiconductor integrated circuit shown in FIG. 2 will be described.

First, an initialization pattern to be supplied to the combinational circuit 106 is set to the scan flip-flops 105 by using the scan path 108. Thus, each node of the combinational circuit 106 is initialized to a desired state. At the same time, a "test pattern generation pattern" is set to the scan flip-flops 103 such that an output of the combinational circuit 104 is set to values of a desired test pattern and then supplied to the combinational circuit 106 through the scan flip-flops 105.

Subsequently, a first clock pulse is supplied from a PLL circuit included in the semiconductor integrated circuit to the scan flip-flops 105 as well as other scan flip-flops. This first clock pulse is often referred to as a "launch clock". In response to this launch clock, the scan flip-flops 105 latch a test pattern from the output of the combinational circuit 104 and supply the latched test pattern to the combinational circuit 106. By supplying the test pattern to the combinational circuit 106, a desired state transition occurs in a fault assumed point, e.g., a wiring or a terminal of a primitive, in the combinational circuit 106. For instance, a logic "1" is set to the fault assumed point in the combinational circuit 106 based on the initialization pattern, and the fault assumed point is then changed to a logic "0" based on the test pattern. Alternatively, the logic "0" is set to the fault assumed point thereof based on the initialization pattern and the logic "1" is then set thereto based on the test pattern.

Next, a second clock pulse is supplied from the PLL circuit to the scan flip-flops 107 as well as other scan flip-flops and the output of the combinational circuit 106 is latched by the scan flip-flops 107. This second clock pulse is often referred to as a "capture clock". Data latched by the scan flip-flops 107 in response to the capture clock is transferred to the LSI tester through the scan path 108. Based on the transferred data, the LSI tester determines whether or not a transition delay fault is present in the combinational circuit 106. If the data latched by the scan flip-flops 107 coincides with an expected value pattern prepared in advance, the LSI tester determines that the state of the fault assumed point in the combinational circuit 106 is changed as designed. If the data latched by the scan flip-flops 107 does not coincide with the expected value pattern, the LSI tester determines that a transition delay fault is present in the combinational circuit 106.

The initialization pattern, the test pattern generation pattern, and the expected value pattern are normally generated by an automatic test pattern generation (ATPG) tool. To generate these patterns for the delay test to the combinational circuit 106, the ATPG tool needs to regard the combinational circuit 104, the scan flip-flops 105, and the combinational circuit 106 as a sequential circuit, and to analyze the operation of the sequential circuit over two clock cycles.

In addition, a semiconductor integrated circuit is disclosed in "DFT Timing Design Methodology for At-Speed BIST", by Yasuo Sato et al. (Proceedings of ASP-DAC 2003, pp. 763-768, IEEE) as a second conventional example. In this conventional example, the semiconductor integrated circuit includes a PLL circuit to supply clock pulses used in an at-speed delay test to each of flip-flops belonging to different clock domains. The "clock domain" means a set of circuits to which a clock signal is supplied from one clock tree. The second conventional example points out that a difference in delay between the clock trees is an obstacle to the at-speed delay test to an inter-domain path, which is a path for transmitting a signal from a flip-flop belonging to one clock domain to a flip-flop belonging to another clock domain. To carry out the at-speed delay test to the inter-domain path, an appropriate number of delay gates are incorporated in the semiconductor integrated circuit in a range from the PLL circuit to inputs of the respective clock trees. By incorporating the delay gates, the difference in delay between the clock trees is compensated to facilitate execution of the at-speed delay test to the inter-domain path.

However, the technique disclosed in the first conventional example is disadvantageous in testability of a multi-cycle path. The multi-cycle path means a combinational circuit to which data is transferred over a plurality of clock cycles. Many combinational circuits are designed to serve as the single cycle path. However, depending on specification of the semiconductor integrated circuit, it is often desirable to use the multi-cycle path. In the semiconductor integrated circuit with the PLL circuit which can generate only continuous clock pulses, as disclosed in the first conventional example, the presence of this multi-cycle path is quite inconvenient for the at-speed delay test using the ATPG tool.

More specifically, the clock periods necessary for analysis by the ATPG tool increases as the number of clock cycles necessary for data to be transmitted to the combinational circuit increases. Generally, in case of the multi-cycle path in which the data is transmitted to the combinational circuits in N clock periods, it is necessary to analyze an operation of the sequential circuit over (N+1) clock periods.

In addition, a scale of the sequential circuit to be analyzed is made large as the number of clock periods necessary for the data transmission to the combinational circuit increases.

The above facts will be described specifically by using the semiconductor integrated circuit shown in FIG. 2. If the combinational circuit 106 is the multi-cycle path to which data is transmitted in two clock periods, a circuit constituted by the combinational circuits 102, 104, and 106, and the scan flip-flops 103 and 105 is assumed as the sequential circuit. It is necessary to analyze the operation of the sequential circuit for three clock periods. The reason is as follows. If the above-stated PLL circuit is used to generate only continuous clock pulses, another clock pulse is supplied to the scan flip-flop 105 between the launch clock for allowing the scan flip-flops 105 to latch the test pattern and the capture clock for allowing the scan flip-flops 107 to latch the output from the combinational circuit 106. It is required to continuously supply such a pattern that a desired state transition occurs in the fault assumed point in the combinational circuit 106 over three clock periods. For this purpose, it is necessary to analyze the operation of the sequential circuit over three clock periods and also determine the patterns to be set to the scan flip-flops 101, 103, and 105. It should be noted that it is sufficient to analyze the operation of the sequential circuit constituted by the combinational circuits 104 and 106 and the scan flip-flop 105 over two clock periods if the combinational circuit 106 is the single clock path.

As could be understood, the use of the multi-cycle path disadvantageously increases a data processing amount necessary for the ATPG tool to generate the test patterns, and necessitates a large capacity of memory to store internal states of the semiconductor integrated circuit, such as the values of scan flip-flops in each clock period. For the semiconductor integrated circuit as large as over ten million gates in scale, increases in the necessary data processing amount and memory capacity are too serious to be accepted economically. Therefore, when the semiconductor integrated circuit includes the PLL circuit that can generate only continuous clock pulses, it is eventually impossible to carry out the at-speed delay test to the multi-cycle path.

Meanwhile, in the second conventional example, an unpractical design restriction is sometimes imposed on the semiconductor integrated circuit to adjust delays of the clock trees. The difference in delay between one clock tree and another clock tree is sometimes as great as ten nanoseconds. In the recent high-speed operation semiconductor integrated circuit, the delay time of one gate is about 100 picoseconds. Therefore, in order to compensate the above delay difference, it would be necessary to provide impractically large number of delay gates between the PLL circuit and the input of the clock tree for adjusting the delays of the clock trees by the delay gates. This indicates that it is impractical to carry out the at-speed delay test to the inter-domain path by adjusting the delay difference between the clock trees by using the delay gates.

As could be understood from the above, no practical techniques for carrying out the at-speed delay test to the multi-cycle path or the inter-domain path are present.

SUMMARY OF THE INVENTION

In an aspect of the present invention, a semiconductor integrated circuit includes an input side flip-flop; a combinational circuit having an input connected with the input side flip-flop; an output side flip-flop connected with an output of the combinational circuit; and a delay test circuit. The delay test circuit generates output clock pulses by removing an optional one from equal to or more than 3 continuing clock pulses of the input clock signal, and supplies the output clock pulses to the input side flip-flop and the output side flip-flop.

Here, the delay test circuit may include a clock waveform setting register configured to receive and hold a clock waveform setting data indicating a waveform of a clock signal; and an output section configured to generate the output clock pulses by masking the input clock signal in response to the clock waveform setting data held by the clock waveform setting register.

Also, the output section includes a shift register configured to receive data bits of the clock waveform setting data from the clock waveform setting register, and sequentially output the data bits in synchronization with the input clock signal; and a clock gating circuit configured to generate the output clock signal by masking the input clock signal in response to the data bits outputted from the shift register.

Also, a first flip-flop as the input side flip-flop belongs to a first clock domain, and a second flip-flop as said output side flip-flop belongs to a second clock domain, and has an input connected with an output of the first flip-flop through an inter-domain path. A first delay test circuit as said delay test circuit supplies a first clock pulse to the first flip-flop through a first clock tree. The semiconductor integrated circuit further includes a second delay test circuit configured to supply a second clock pulse to the second flip-flop through a second clock tree. At least one of a first output timing at which the first delay test circuit outputs the first clock pulse, and a second output timing at which the second delay test circuit outputs the second clock pulse is adjustable.

Here, the semiconductor integrated circuit may further include a first clock supplying section configured to generate the first input clock signal from a test reference clock signal and supply the first input clock signal to the first delay test circuit; and a second clock supplying section configured to generate the second input clock signal from the test reference clock signal and to supply the second delay test circuit. The first delay test circuit generates the first clock pulse by masking a part of the first input clock signal, and the second delay test circuit generates the second clock pulse by masking a part of the second input clock signal.

Also, the first clock supplying section may select the test reference clock signal and a clock signal obtained by inverting the test reference clock signal and supplies the selected clock signal to the first delay test circuit as the first input clock signal.

Also, the semiconductor integrated circuit may further include a first clock supplying section configured to generate the first input clock signal from the test reference clock signal and supply the first input clock signal to the first delay test circuit; and a second clock supplying section configured to generate the second input clock signal from the test reference clock signal and to supply the second input clock signal to the second delay test circuit. The first delay test circuit may generate the first clock pulse by masking the first input clock signal, and the second delay test circuit may generate the second clock pulse by masking the second input clock signal. The second clock supplying section may select one of the test reference clock signal and a clock signal obtained by inverting the test reference clock signal and supplies the selected clock signal to the second delay test circuit as the second input clock signal.

Also, the semiconductor integrated circuit may further include a first clock generation start signal generation circuit configured to generate a first clock generation start signal in response to a clock generation synchronization signal and supply the first clock generation start signal to the first delay test circuit; and a second clock generation start signal generation circuit configured to generate a second clock generation start signal in response to the clock generation synchronization signal and supply the second clock generation start signal to the second delay test circuit. The first delay test circuit may generate the first clock pulse to have a waveform corresponding to the first clock waveform setting data, and the second delay test circuit may generate the second clock pulse to have a waveform corresponding to the second clock waveform setting data. The first delay test circuit may start generation of the first clock pulse in response to activation of the first clock generation start signal. Also, the second delay test circuit may start generation of the second clock pulse in response to the activation of the second clock generation start signal. A delay time from the activation of the clock generation sync signal to the activation of the first clock generation start signal is different from a delay time from the activation of the clock generation sync signal to the activation of the second clock generation start signal.

In another aspect of the present invention, a delay test circuit includes a clock waveform setting register configured to input and hold a clock waveform setting data indicating a waveform of a clock signal; and a clock gating circuit configured to generate an output clock signal as a pulse signal in which an optional pulse is removed from equal to or more than 3 continuing clock pulses of an input clock signal in response to the clock waveform setting data.

Here, the delay test circuit may further include a shift register configured to receive data bits of the clock waveform setting data from the clock waveform setting register, and sequentially output the Data bits in synchronization with the input clock signal. The clock gating circuit may generate the output clock signal by masking a part of pulse string of the input clock signal in response to the data bits outputted from the shift register.

In another aspect of the present invention, a method of testing a semiconductor integrated circuit is achieved by providing a semiconductor integrated circuit comprising an input side flip-flop, a combinational circuit as a multi-cycle path having an input connected with the input side flip-flop, and an output side flip-flop connected with an output of the combinational circuit; by generating an output clock signal containing pulses obtained by removing an optional one from equal to or more than 3 continuing clock pulses of a clock signal; by supplying the output clock signal to the input side flip-flop and the output side flip-flop; and by detecting a fault of the semiconductor integrated circuit based on a value from the combinational circuit latched by the output side flip-flop in response to the output clock signal.

Here, the method may be achieved by further supplying the clock waveform setting data indicating a waveform of the output clock signal to the delay test circuit built in the semiconductor integrated circuit. The generation of the output clock signal may be carried out by masking the clock signal by the delay test circuit in response to the clock waveform setting data and outputting as the output clock signal, the pulses of the clock signal which are not masked.

Also, a first flip-flop as the input side flip-flop belongs to a first clock domain, a second flip-flop as the output side flip-flop belongs to a second clock domain and has an input connected with an output of the first flip-flop through an inter-domain path. The semiconductor integrated circuit may further include a first delay test circuit, and a second delay test circuit. The method may be achieved by further setting a first output timing at which a first clock pulse is outputted to the first delay test circuit; by setting a second output timing at which a second clock pulse is outputted to the second delay test circuit; by supplying the first clock pulse to the first flip-flop through a first clock tree by outputting the first clock pulse from the first delay test circuit at the first output timing; by supplying the second clock pulse to the second flip-flop through a second clock tree by outputting the second clock pulse from the second delay test circuit at the second output timing; and by detecting a defect of the semiconductor integrated circuit based on a value latched from inter-domain path by the second flip-flop in response to the second clock pulse.

Here, the setting a first output timing may be achieved by setting the first clock waveform setting data indicating a waveform of the first clock pulse to the first delay test circuit. Also, the supplying the first clock pulse may be achieved by generating the first clock pulse to have a waveform specified based on the first clock waveform setting data.

Also, the setting a second output timing may be achieved by setting the second clock waveform setting data indicating a waveform of the second clock pulse to the second delay test circuit. The supplying the second clock pulse may be achieved by generating the second clock pulse to have a waveform specified based on the second clock waveform setting data.

BRIEF DESCRIPTION OF THE DRAWINGS

FIGS. 14A to 14K are timing charts of an operation of the semiconductor integrated circuit shown in FIG. 13;

FIG. 15 is a circuit diagram of yet another configuration of the semiconductor integrated circuit configured to be able to test the inter-domain path by using the two delay test circuits shown in FIG. 3; and FIGS. 16A to 16N are timing charts of an operation of the semiconductor integrated circuit shown in FIG. 15.

DESCRIPTION OF THE PREFERRED EMBODIMENTS

Hereinafter, a semiconductor integrated circuit with a delay test circuit and a method for testing the same according to the present invention will be described in detail with reference to the attached drawings.

The present invention is based on the discovery that an at-speed delay test of a multi-cycle path and an inter-domain path becomes practicable by controlling generation timing of clock pulses within the semiconductor integrated circuit to be tested. More specifically, according to the present invention, a delay test circuit is incorporated into the semiconductor integrated circuit and generates the clock pulses used in the at-speed delay test. The delay test circuit generates a clock signal having a waveform corresponding to clock waveform setting data supplied from an LSI tester. By setting an appropriate clock waveform setting data, a desired number of clock pulses are output at desired timings. A configuration and an operation of the delay test circuit will be first described below. In addition, a method for testing the multi-cycle path and the inter-domain path by using the delay test circuit will be then described.

1: Delay Test Circuit (1) Configuration

Figure 1:
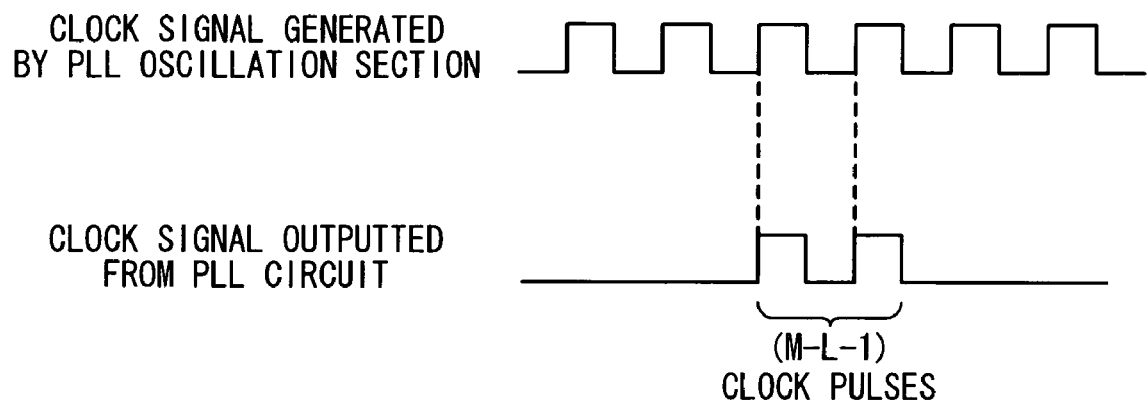
FIG. 1 is a timing chart of an operation of a PLL circuit included in a conventional semiconductor integrated circuit.
Figure 2:
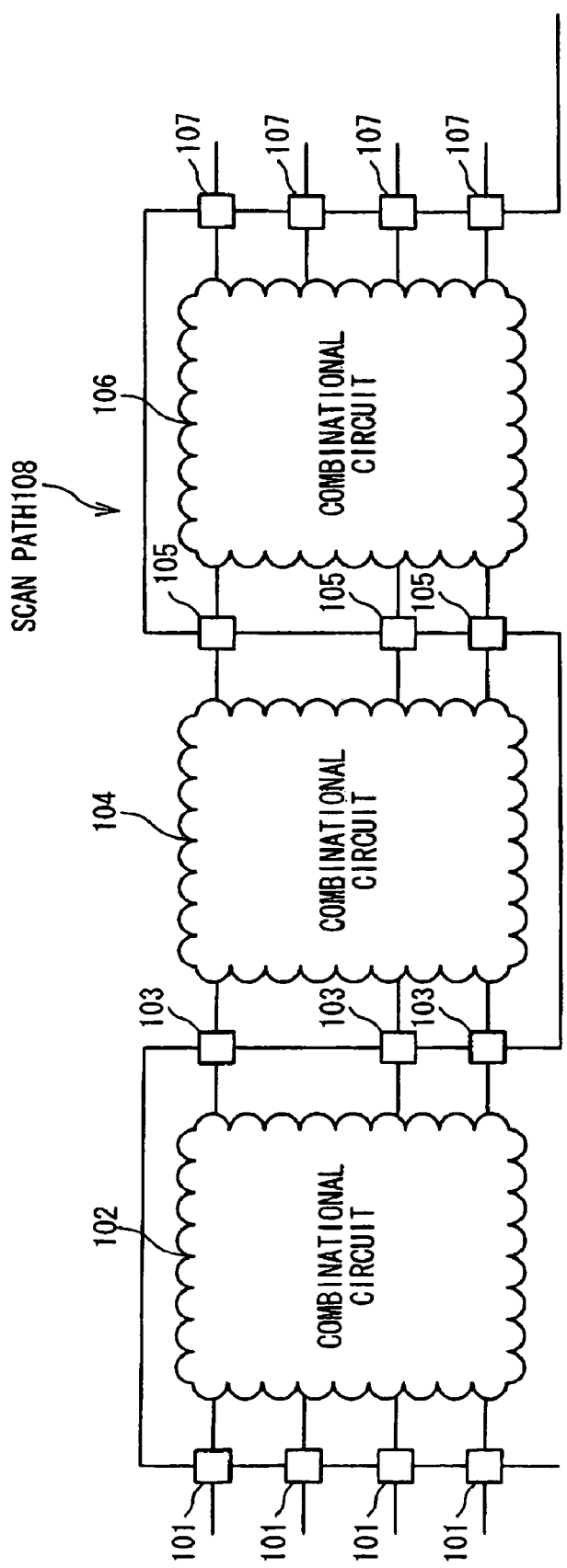
FIG. 2 is a conceptual view of an exemplary configuration of a semiconductor integrated circuit into which a scan path is incorporated.
Figure 3:
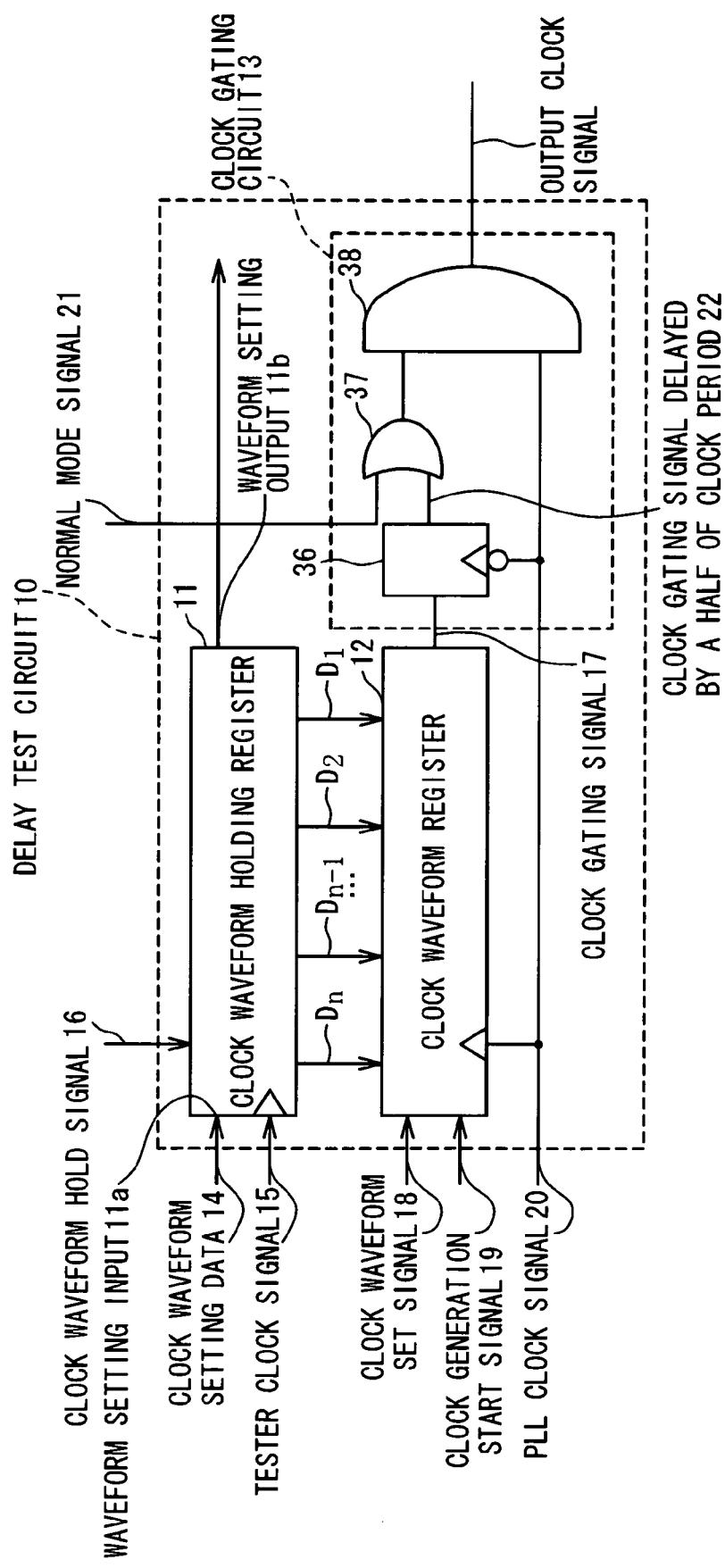
FIG. 3 is a circuit diagram of a configuration of a delay test circuit in the semiconductor integrated circuit according to a first embodiment of the present invention.

FIG. 3 is a block diagram of a configuration of a delay test circuit 10 used in a semiconductor integrated circuit according to the first embodiment of the present invention. The delay test circuit 10 includes a clock waveform holding register 11, a clock waveform register 12, and a clock gating circuit 13.

The clock waveform holding register 11 includes a waveform setting input 11a to receive a clock waveform setting data 14 in synchronization with a tester clock signal 15 in accordance with a clock waveform hold signal 16. The clock waveform setting data 14 is a data for designating a waveform of a clock signal to be outputted from the delay test circuit 10, and is supplied from a LSI tester (not shown). The clock waveform setting data 14 is an n-bit data and the clock waveform holding register 11 is an n-bit shift register. The clock waveform holding register 11 serially receives and holds data bits $D_1$ to $D_n$ of the clock waveform setting data 14 and outputs the held data bits $D_1$ to $D_n$ in parallel.

Figure 4:
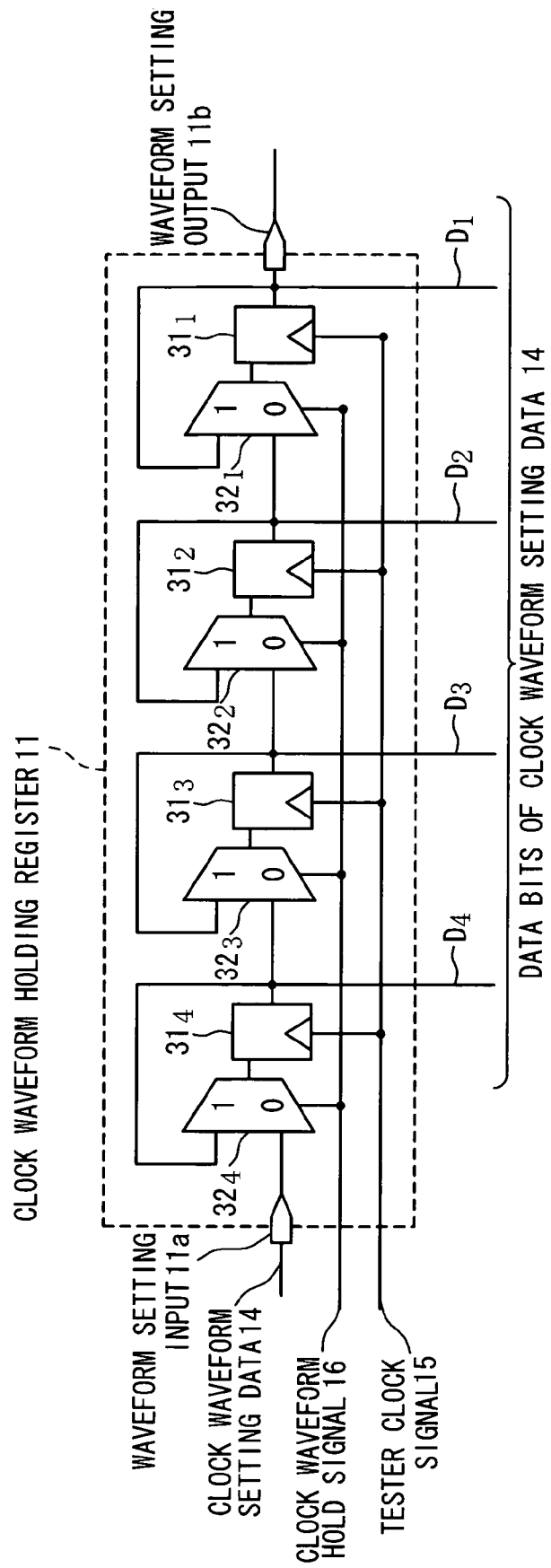
FIG. 4 is a circuit diagram of a configuration of a clock waveform holding register incorporated in the delay test circuit according to the first embodiment of the present invention.

FIG. 4 is a circuit diagram of a specific configuration of the clock waveform holding register 11 in case where the number of data bits of the clock waveform setting data 14 is four. The clock waveform holding register 11 includes flip-flops $31_1$ to $31_4$ and selectors $32_1$ to $32_4$. Outputs of the selectors $32_1$ to $32_4$ are connected to inputs of the flip-flops $31_1$ to $31_4$, respectively. A first input of the selector $32_4$ is connected to the waveform setting input 11a and a second input thereof is connected to the output of the flip-flop $31_4$. A first input of the selector $32_3$ is connected to the output of the flip-flop $31_4$ and a second input thereof is connected to the output of the flip-flop $32_3$. Likewise, a first input and a second input of the selector $32_2$ are connected to the output of the flip-flop $31_3$ and the output of the flip-flop $31_2$, respectively. A first input and a second input of the selector $32_1$ are connected to the output of the flip-flop $31_2$ and the output of the flip-flop $31_1$, respectively. The output of the flip-flop $31_1$ is connected to the waveform setting output 11b.

The clock waveform holding register 11 is controlled based on the tester clock 15 and a clock waveform holding signal 16. The tester clock signal 15 is supplied from the outside of the delay test circuit 10, i.e., from the LSI tester (not shown), to clock inputs of the respective flip-flops $31_1$ to $31_4$. The clock waveform holding register 11 sequentially latches data bits $D_1$ to $D_4$ of the clock waveform setting data 14 in synchronization with this tester clock signal 15. The clock waveform holding signal 16 is a signal for designating whether the clock waveform setting data 14 should be received and latched from the outside or hold the latched data without being received from the outside. The clock waveform holding signal 16 is supplied to control inputs of the respective selectors $32_1$ to $32_4$. In this embodiment, if the clock waveform holding signal 16 is inactivated or set to "0", the clock waveform holding register 11 sequentially latches the data bits $D_1$ to $D_4$ of the clock waveform setting data 14 in synchronization with the tester clock signal 15. At the time of completion of latching the clock waveform setting data 14, the data bits $D_1$ to $D_4$ are held in the flip-flops $31_1$ to $31_4$, respectively. It would be obvious to those skilled in the art that the number of flip-flops and the number of selectors provided in the clock waveform holding register 11 are determined depending on the number n of the data bits of the clock waveform setting data 14.

Referring back to FIG. 3, the clock waveform holding register 11 has a waveform setting output 11b and outputs the clock waveform setting data 14 to the outside of the delay test circuit 10. The clock waveform register 12 is an n-bit shift register that latches the data bits $D_1$ to $D_n$ of the clock waveform setting data 14 from the clock waveform holding register 11 in parallel, and serially outputs the latched data bits $D_1$ to $D_n$. The data bits $D_1$ to $D_n$ serially outputted from the clock waveform register 12 are used as a clock gating signal 17 for controlling the clock gating circuit 13. The clock waveform setting data 14 and the clock gating signal 17 are latched and outputted in synchronization with an input PLL clock signal 20, respectively. The input PLL clock signal 20 is generated by a PLL circuit (not shown) built in the target semiconductor integrated circuit. The input PLL clock signal 20 has a frequency corresponding to an operating rate of the semiconductor integrated circuit.

Figure 5:
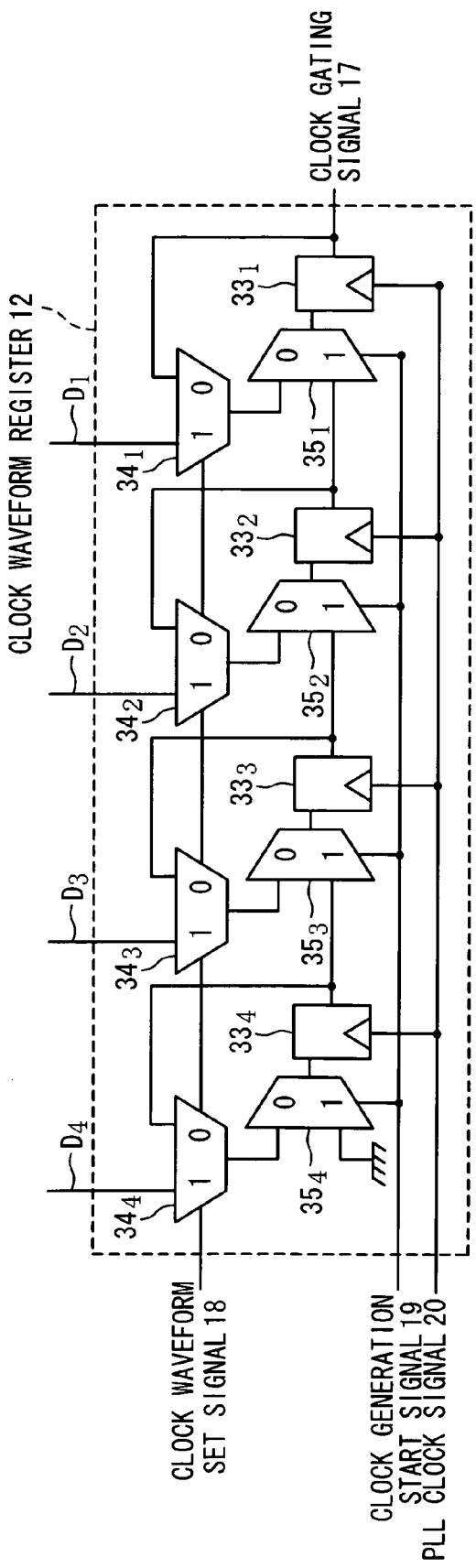
FIG. 5 is a circuit diagram of a configuration of a clock waveform register incorporated in the delay test circuit according to the first embodiment of the present invention.

FIG. 5 is a circuit diagram of a specific configuration of the clock waveform register 12 when the number n of data bits of the clock waveform setting data 14 is four. The clock waveform register 12 includes flip-flops $33_1$ to $33_4$ and selectors $34_1$ to $34_4$ and $35_1$ to $35_4$. First inputs of the selectors $34_1$ to $34_4$ are connected to outputs of the flip-flops $33_1$ to $33_4$, respectively. Second inputs of the selectors $34_1$ to $34_4$ are connected to the flip-flops $31_1$ to $31_4$ of the clock waveform holding register 11, respectively. In other words, the data bits $D_1$ to $D_n$ of the clock waveform setting data 14 are supplied to the second inputs of the respective selectors $34_1$ to $34_4$. First inputs of the selectors $35_1$ to $35_4$ are connected to outputs of the selectors $34_1$ to $34_4$, respectively. Second inputs of the $35_1$ to $35_3$ are connected to the outputs of the flip-flops $33_2$ to $33_4$, respectively, and a second input of the selector $35_4$ is connected to a ground terminal.

The clock waveform register 12 is controlled in response to a clock waveform setting signal 18 and a clock generation start signal 19. The clock waveform setting signal 18 is a signal for permitting the data bits $D_1$ to $D_4$ of the clock waveform setting data 14 to be latched. The clock generation start signal 19 is a signal for permitting the clock gating signal 17 to be outputted, that is, the data bits $D_1$ to $D_4$ to be outputted. The clock waveform setting signal 18 is supplied to control the inputs of the selectors $34_1$ to $34_4$, whereas the clock generation start signal 19 is supplied to control the inputs of the selectors $35_1$ to $35_4$. When the input PLL clock signal 20 is supplied in a state in which the clock waveform setting signal 18 is activated and the clock generation start signal 19 is inactivated, the clock waveform register 12 latches the data bits $D_1$ to $D_4$ of the clock waveform setting data 14 in synchronization with a rising edge of the input PLL clock signal 20. Further, when the input PLL clock signal 20 is supplied in a state in which the clock waveform setting signal 18 is inactivated and the clock generation start signal 19 is activated, the clock waveform register 12 sequentially shifts and outputs the data bits $D_1$ to $D_n$ of the data waveform setting data 14 in synchronization with the rising edge of the input PLL clock signal 20.

Referring back to FIG. 3 again, the clock gating circuit 13 is a circuit that gates the input PLL clock signal 20 supplied from the PLL circuit (not shown) in response to the clock gating signal 17 supplied from the clock waveform register 12 and a normal mode signal 21 supplied externally. The normal mode signal 21 is a signal for designating an operation mode of the semiconductor integrated circuit in which the delay test circuit 10 is incorporated. The normal mode signal 21 is activated or set to "High" in the present embodiment, during a normal operation and inactivated when a test is carried out. Specifically, the clock gating circuit 13 includes a flip-flop 36, an OR gate 37, and an AND gate 38. The clock gating signal 17 is supplied to a data input of the flip-flop 36, and the input PLL clock signal 20 is supplied to the clock input thereof. The flip-flop 36 latches the clock gating signal 17 in synchronization with a falling edge of the input PLL clock signal 20, and outputs a clock gating signal 22 delayed by a half period. The normal mode signal 21 is supplied to a first input of the OR gate 37 and the half-period delayed clock gating signal 22 is supplied to a second input thereof. The output of the OR gate 37 is connected to a first input of the AND gate 38. The input PLL clock 20 is supplied to a second input of the AND gate 38. A target output clock $CLK_{OUT}$ is outputted from an output of the AND gate 38.

When the normal mode signal 21 is activated, the clock gating circuit 13 outputs the input PLL clock signal 20 as the output clock signal $CLK_{OUT}$ as it is, irrespectively of the clock gating signal 17. When the normal mode signal 21 is inactivated, the clock gating circuit 13 masks the input PLL clock signal 20 in response to the clock gating signal 17. Specifically, when the clock gating signal 17 is "Low" in a certain clock period, the clock gating circuit 13 masks the input PLL clock signal 20 in a subsequent clock period. Conversely, when the clock gating signal 17 is "High" in the certain clock period, the clock gating circuit 13 outputs the input PLL clock signal as it is in the subsequent clock period. In other words, the clock gating circuit 13 outputs a clock pulse only in the clock period subsequent to the clock period in which the clock gating signal 17 is "High". The clock gating circuit 13 does not output a clock pulse in the clock period subsequent to the clock period in which the clock gating signal 17 is "Low".

(2) Operation

As stated above, the delay test circuit 10 shown in FIG. 3 can generate the output clock signal $CLK_{OUT}$ having a waveform according to the clock waveform setting data 14. The steps of setting a waveform based on the clock waveform setting data 14 and generating the output clock signal $CLK_{OUT}$ according to the clock waveform setting data 14 will be described in this order.

Figure 6:
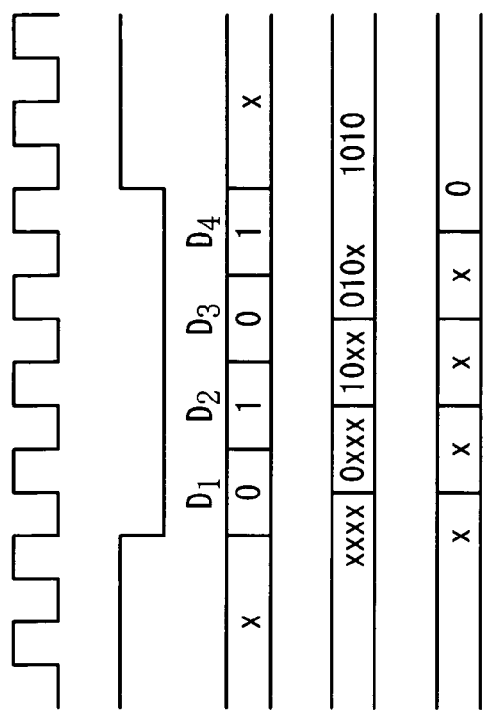
FIGS. 6A to 6E are timing charts of an operation for setting clock waveform setting data to the clock waveform holding register in the first embodiment.

Step S01:

The clock waveform setting data 14 is first supplied to the clock waveform holding register 11, and a waveform of the desired output clock signal $CLK_{OUT}$ is set to the delay test circuit 10. Specifically, while the clock waveform holding signal 16 is inactivated as shown in FIG. 6B, the respective data bits $D_1$ to $D_4$ of the clock waveform setting data 14 are sequentially supplied to the waveform setting input 11a in synchronization with the tester clock 15 as shown in FIG. 6C. The data bits $D_1$ to $D_4$ of the clock waveform setting data 14 designate the clock pulses in four clock periods, respectively, after the clock generation start signal 19 is activated. Values of the data bits $D_1$ to $D_4$ are set based on whether or not outputs of the clock pulses in the corresponding clock periods are present. The data bits $D_1$ to $D_4$ are set to "1" when clock pulses are outputted in the corresponding clock periods. The data bits $D_1$ to $D_4$ are set to "0" when the clock pulses are not outputted in the corresponding clock periods. For instance, if a clock pulse is not outputted in the first clock period after the clock generation start signal 19 is activated, the data bit $D_1$ is set to "0". In the example of FIG. 6C in which the data bits $D_1$, $D_2$, $D_3$, and $D_4$ are set to "0", "1", "0", and "1", the delay test circuit 10 is set to output the clock pulses in the second and fourth clock periods after the clock generation start signal 19 is activated.

When the setting of the clock waveform setting data 14 to the clock waveform holding register 11 is completed, the clock waveform holding signal 16 is activated, as shown in FIG. 6B. In response to the setting, the outputs of the respective flip-flops $31_1$ to $31_4$ of the clock waveform holding register 11 are connected to the data inputs thereof, and the clock waveform holding register 11 holds the clock waveform setting data 14.

Figure 7:
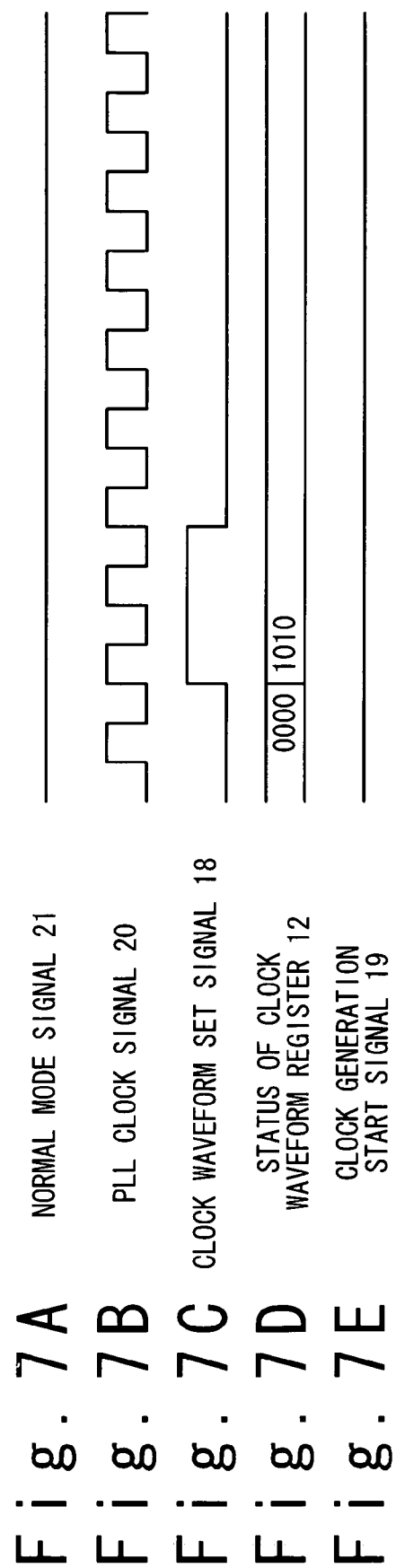
FIGS. 7A to 7E are timing charts of an operation for setting data bits of the clock waveform setting data to the clock waveform register in the first embodiment.

Step S02:

The respective data bits $D_1$ to $D_4$ of the clock waveform setting data 14 held in the clock waveform holding register 11 are transferred to the clock waveform register 12 in parallel. Specifically, while the clock generation start signal 19 is inactivated as shown in FIG. 7E, the clock waveform setting signal 18 is activated as shown in FIG. 7C. In response to the activation, the data bits $D_1$ to $D_4$ are transferred to the flip-flops $33_1$ to $33_4$ of the clock waveform register 12 in synchronization with the rising edge of the input PLL clock 20 as shown in FIG. 7D. After the transfer of the data bits $D_1$ to $D_4$ to the flip-flops $33_1$ to $33_4$, the clock waveform setting signal 18 is inactivated as shown in FIG. 7C. In response to the inactivation, the outputs of the respective flip-flops $33_1$ to $33_4$ of the clock waveform register 12 are connected to the data inputs thereof, and the clock waveform register 12 holds the clock waveform setting data 14.

Step S03:

The data bits $D_1$ to $D_4$ set to the clock waveform register 12 are sequentially transferred to the clock gating circuit 13 as the clock gating signal 17, and the output clock signal $CLK_{OUT}$ having the waveform corresponding to the data bits $D_1$ to $D_4$ is generated. FIGS. 8A to 8H are timing charts showing a process of generating the output clock signal $CLK_{OUT}$.

Figure 8:
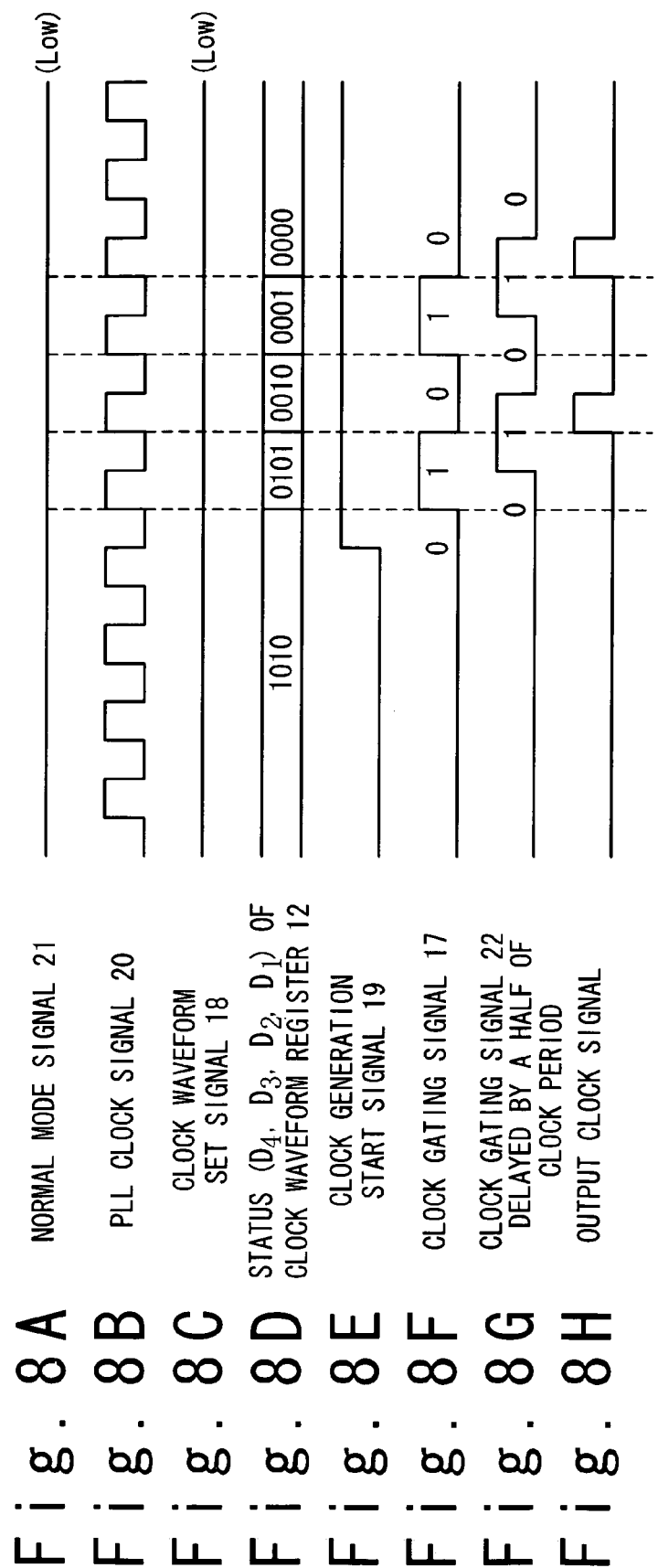
FIGS. 8A to 8H are timing charts of an operation of the delay test circuit for outputting an output clock signal in the first embodiment.

In an initial state, the clock gating signal 17 has a value corresponding to the value of the data bit $D_1$. In the example of FIG. 8F, the clock gating signal 17 is initially set to "Low". The clock waveform setting signal 18 and the clock generation start signal 19 are set to the inactivated state as shown in FIGS. 8C and 8E. If the clock generation start signal 19 is activated as shown in FIG. 8E, while the clock waveform setting signal 18 is inactivated as shown in FIG. 8C, the data bits $D_1$ to $D_4$ are sequentially transferred in synchronization with the input PLL clock signal 20. In other words, the value of the clock gating signal 17 is switched in response to the values of the data bits $D_1$ to $D_4$ as shown in FIG. 7F. In response to the clock gating signal 17, the clock gating circuit 13 outputs the output clock signal $CLK_{OUT}$ as shown in FIG. 7H. As a result, the output clock signal $CLK_{OUT}$ is generated so as to have pulse waveforms corresponding to the respective data bits $D_1$ to $D_4$ of the clock waveform setting data 14.

When the output clock signal $CLK_{OUT}$ of the same waveform is outputted again, the steps S02 and S03 are repeated by a desired number of times.

The delay test circuit 10 can generate the output clock signal $CLK_{OUT}$ having the desired waveform by appropriately setting the respective data bits $D_1$ to $D_4$ of the clock waveform setting data 14. For instance, when two continuous bits of the data bits $D_1$ to $D_4$ are set to "1", specifically, the data bits $D_1$ to $D_4$ are set to "0011" or "0110", the output clock signal $CLK_{OUT}$ of two continuous clock pulses can be generated. It should be noted that the delay test circuit 10 can generate two discontinuous clock pulses by appropriately setting the clock waveform setting data 14. For instance, as shown in FIGS. 8A to 8H, when the data bits $D_1$ to $D_4$ are set to "1010", clock pulses can be outputted discontinuously, so as to insert a clock period in which no clock pulses are outputted between the clock periods in which clock pulses are generated. As stated later, the output of the two separate clock pulses is quite effective when the at-speed delay test is carried out to a multi-cycle path.

Further, it should be noted that timing at which clock pulses are outputted from the delay test circuit 10 can be controlled in units of clock periods by appropriately setting the clock waveform setting data 14. For instance, if the data bits $D_1$ to $D_4$ are set to "1000", the delay test circuit 10 outputs one clock pulse in the next clock period to the clock period in which the clock generation start signal 19 is activated. If the data bits $D_1$ to $D_4$ are set to "0001", the delay test circuit 10 outputs one clock pulse in a fourth clock period after the clock generation start signal 19 is activated. The control of the timing at which the clock pulses are outputted is quite effective when the at-speed delay test is carried out to the inter-domain path as will be described later.

2: At-Speed Test to Multi-Cycle Path

As already stated, the delay test circuit 10 shown in FIG. 3 has the configuration suitable to realize the at-speed delay test to the multi-cycle path. A method for carrying out the at-speed delay test to the multi-cycle path by using the delay test circuit 10 shown in FIG. 3 will be described.

Figure 9:
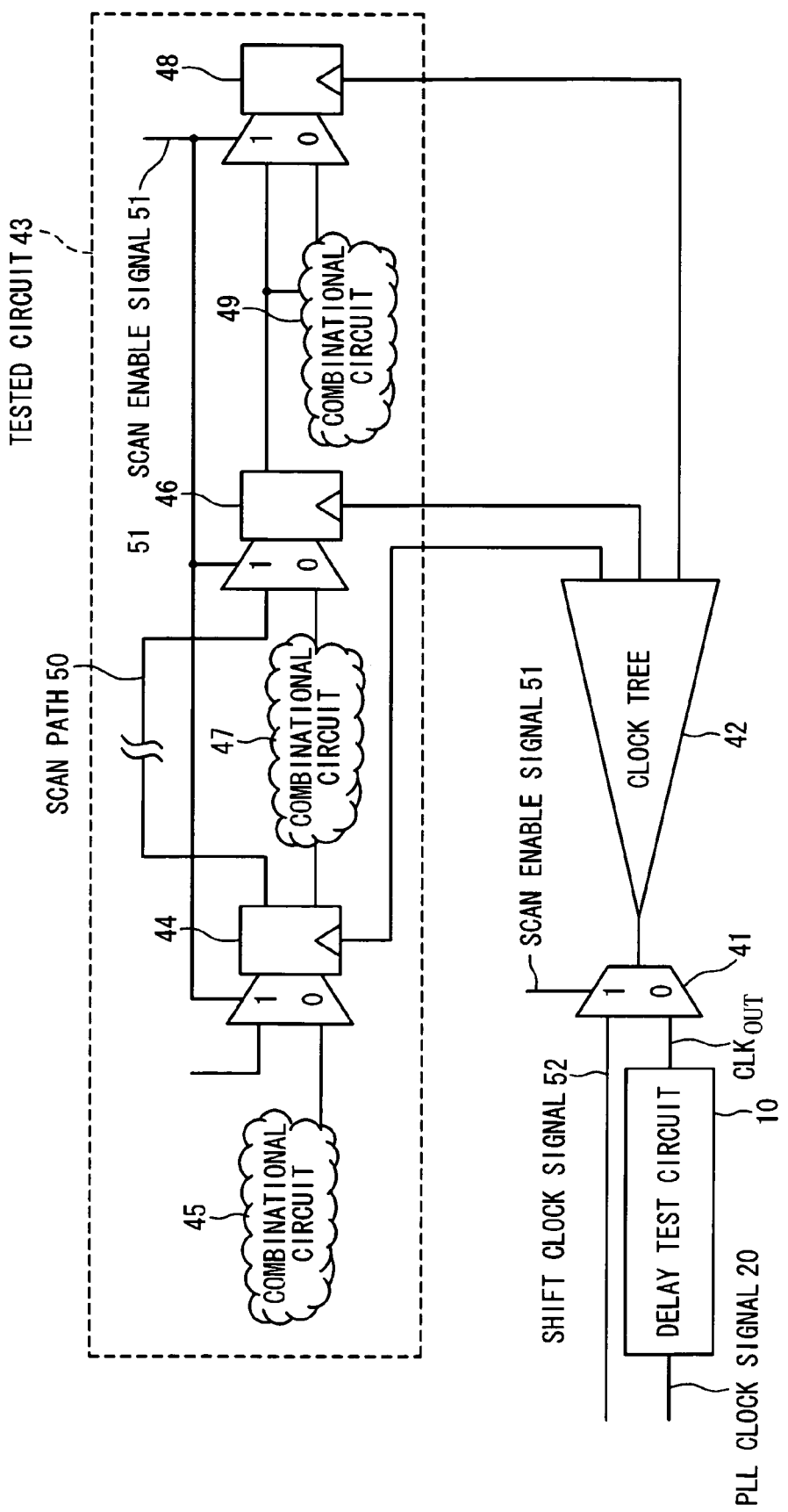
FIG. 9 is a block diagram of a semiconductor integrated circuit configured to be able to test a multi-cycle path by using the delay test circuit shown in FIG. 3.

FIG. 9 is a block diagram showing a configuration of a target semiconductor integrated circuit with the delay test circuit 10 for the at-speed delay test to the multi-cycle path. A target circuit 43 to be tested of the semiconductor integrated circuit includes scan flip-flops 44, 46, and 48, and combinational circuits 45, 47, and 49. The scan flip-flops 44, 46, and 48 constitute a scan path 50. A scan enable signal 51 is supplied to selectors of the scan flip-flops 44, 46, and 48. Each of the selectors of the scan flip-flops 44, 46, and 48 selects one of data inputs in response to the scan enable signal 51. Specifically, when the scan enable signal 51 is activated, that is, the scan enable signal 51 is set to "1" in the present embodiment, the respective selectors of the scan flip-flops 44, 46, and 48 select the data inputs related to the scan path 50; otherwise, the respective selectors of the scan flip-flops 44, 46, and 48 select the data inputs connected to the combinational circuits 45, 47, and 49.

The combinational circuits 45 and 47 are single-cycle paths, and the combinational circuit 49 is a multi-cycle path in which data is transferred with two clock periods. As will be stated later, the at-speed delay test to the combinational circuit 49 as the multi-cycle path is carried out in the semiconductor integrated circuit shown in FIG. 9.

A clock system that distributes a clock signal to the scan flip-flops 44, 46, and 48 includes the delay test circuit 10, a selector 41, and a clock tree 42. A shift clock signal 52 supplied from the LSI tester (not shown) is supplied to a first input of the selector 41, and the output clock signal $CLK_{OUT}$ outputted from the delay test circuit 10 is supplied to a second input thereof. The shift clock signal 52 is a clock signal used to shift data on the scan path 50 and is supplied from the LSI tester (not shown). The scan enable signal 51 is supplied to a control input of the selector 41. If the scan enable signal 51 is inactivated, that is, the scan enable signal 51 is set to "0" in this embodiment, the selector 41 selects the output clock signal $CLK_{OUT}$ outputted from the delay test circuit 10. If the scan enable signal 51 is activated, the selector 41 selects the shift clock signal 52.

In the semiconductor integrated circuit shown in FIG. 9, the at-speed delay test is carried out to the combinational circuit 49 as the multi-cycle path in the following procedure.

First, the delay test circuit 10 is set to output two clock pulses to have the number of clock periods necessary to transfer data on the combinational circuit 49 between the two clock pulses. In the present embodiment, the clock waveform setting data 14 is set to the delay test circuit 10 to designate that two clock pulses are outputted to have one clock period between the two clock periods. As already stated, the clock waveform setting data. 14 is first latched by the clock waveform holding register 11 and then transferred from the clock waveform holding register 11 to the clock waveform register 12. More specifically, the clock waveform setting data 14 in which two bits of "1" are discontinuously arranged is held in the delay test circuit 10. For instance, the data bits $D_1$ to $D_4$ of the clock waveform setting data 14 are set to "0101". Alternatively, the data bits $D_1$ to $D_4$ of the clock waveform setting data 14 may be set to "1010". As stated later, it is important to carry out the at-speed delay test to the combinational circuit 49 that two clock pulses are outputted from the delay test circuit 10 to have one clock period between two clock pulses.

More specifically, an initialization pattern is set to the scan flip-flop 46 and a test pattern output pattern is set to the scan flip-flop 44. The initialization pattern is determined so that each node of the combinational circuit 49 is initialized into a desired state. The test pattern output pattern is determined so that a desired test pattern to be supplied to the combinational circuit 49 is supplied from an output of the combinational circuit 47 to an input of the scan flip-flop 46. The initialization pattern and the test pattern output pattern are set through the following procedure. The scan enable signal 51 is initialized and the shift clock signal 52 is supplied from the LSI tester. In synchronization with the shift clock signal 52, the initialization pattern and the test pattern output pattern are supplied to the scan path 50 from the LSI tester. Thus, the initialization pattern is set to the scan flip-flop 46 whereas the test pattern output pattern is set to the scan flip-flop 44. Upon completion of setting the scan test pattern output pattern to the scan flip-flop 44, the supply of the shift clock signal 52 is stopped and the scan enable signal 51 is inactivated. The initialization pattern and the test pattern output pattern are determined by the ATPG tool installed in the LSI tester. The ATPG tool analyzes an operation of the sequential circuit under the assumption the combinational circuits 47 and 49 and the scan flip-flop 46 as the sequential circuit, and determines the initialization pattern and the test pattern output pattern. The ATPG tool also generates an expected value pattern to be outputted from the target combinational circuit 49.

Figure 10:
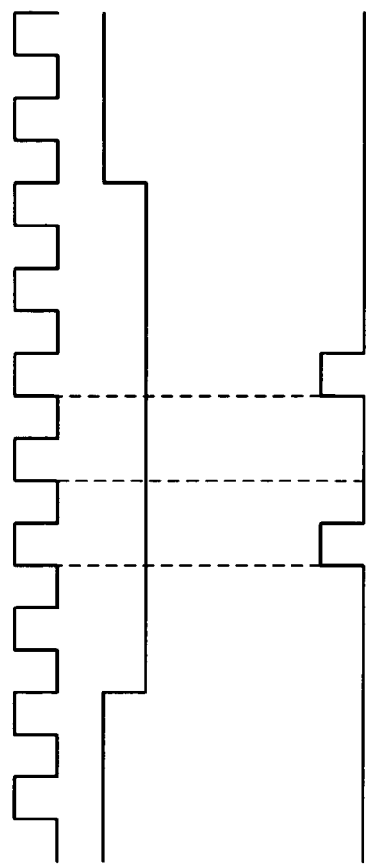
FIGS. 10A to 10C are timing charts of a waveform of the output clock signal outputted from the delay test circuit incorporated into the semiconductor integrated circuit shown in FIG. 9.

After completion of the setting of the delay test circuit 10 and the setting of the initialization pattern and the test pattern output pattern, the clock generation start signal 19 is activated. As a result, as shown in FIGS. 10A to 10C, a clock signal having a waveform corresponding to the values of the clock waveform setting data 14, are supplied from the delay test circuit 10 to the scan flip-flops 44, 46, and 48. That is, two clock pulses are outputted to have one clock period between two clock periods.

The clock pulse outputted first is used as the launch clock pulse. In response to input of the launch clock pulse, the scan flip-flop 46 starts supplying a desired test pattern to the combinational circuit 49. In response to the supply, a desired state transition occurs in a fault assumed point, e.g., a wiring or a terminal of a primitive, of the combinational circuit 49. On the other hand, the clock pulse outputted second is used as the capture clock pulse. In response to input of the capture clock pulse, the scan flip-flop 48 latches the output of the combinational circuit 49.

Further, the data latched by the scan flip-flop 48 in response to the capture clock pulse is transferred to the LSI tester through the scan path 50. The LS tester determines whether or not a transition delay fault is present in the combinational circuit 49, based on the data latched by the scan flip-flop 48. If the data latched by the scan flip-flop 48 does not coincide with the expected value pattern, the LSI tester determines that the transition delay fault is present in the combinational circuit 49.

In the at-speed delay test carried out to the combinational circuit 49 through these steps, even if the combinational circuit 49 is the multi-cycle path, the test pattern for the at-speed delay test to the multi-cycle path can be generated with an equivalent data processing amount and equivalent memory capacity to those of a data processing for the single-period path in the conventional example. In the test procedure according to this embodiment, the combinational circuit 47 and 49 and the scan flip-flop 46 are assumed as the sequential circuit, and the operation of the sequential circuit is analyzed. It is thereby possible to generate the initialization pattern, the test pattern output pattern, and the expected value pattern. It is unnecessary to consider the operation of the combinational circuit 45 and the scan flip-flop 46 in analysis of the operation. As could be understood, in the semiconductor integrated circuit shown in FIG. 9, the test pattern can be generated for the at-speed delay test to the multi-cycle path by the ATPG tool.

The at-speed delay test to the combinational circuit 49 carried out through the above procedure can be applied to a case where the number of clock periods necessary to transfer data on the combinational circuit 49 is more than two. If the number of clock periods necessary to transfer data on the combinational circuit 49 is N, the delay test circuit 10 may be set to output two clock pulses to have (N−1) clock periods between the two clock pulses. The number of data bits of the clock waveform setting data 14 may be equal to or greater than (N+1). If necessary, the design of the delay test circuit 10 is modified according to the number of bits of the clock waveform setting data 14. Specifically, the number of bits which can be held in the clock waveform holding register 11 and the clock waveform register 12 is modified according to the number of bits of the clock waveform setting data 14. 3: At-Speed Test to Inter-Clock-Domain Path (1) Test to Inter-Domain Path by Using Delay Test Circuit As already stated, the delay test circuit 10 shown in FIG. 3 is also suitable to accomplish the at-speed delay test to an inter-domain path. A method for carrying out the at-speed delay test to the inter-domain path by using the delay test circuit 10 will be described.

Figure 11:
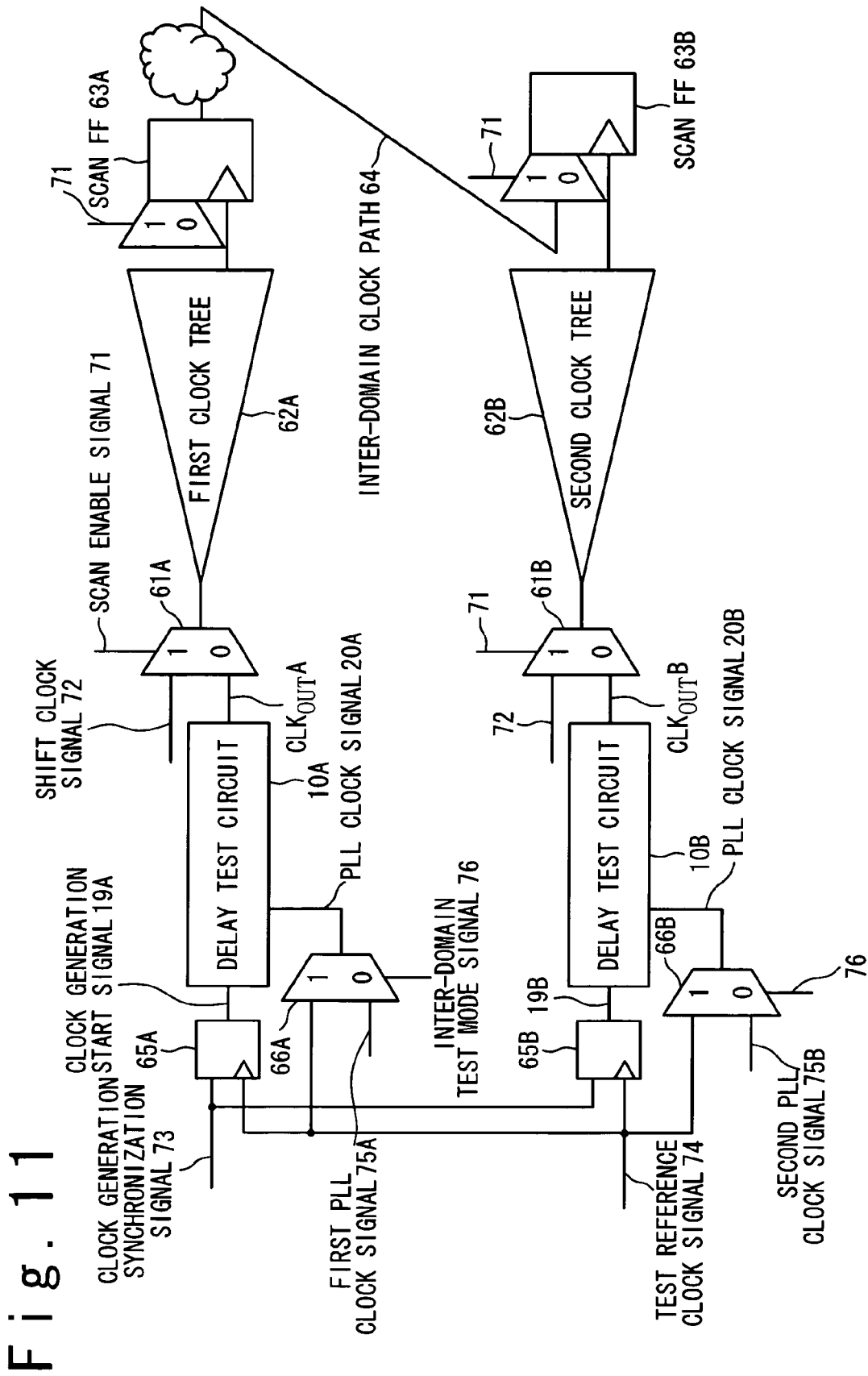
FIG. 11 is a block diagram of a semiconductor integrated circuit configured to be able to test an inter-domain path by using two delay test circuits shown in FIG. 3.

FIG. 11 is a block diagram of a configuration of the target semiconductor integrated circuit in which the at-speed delay test to the inter-domain path is carried out by using the delay test circuit 10. An inter-domain path 64 is provided between scan flip-flops 63A and 63B and tested in the present embodiment. To carry out the at-speed delay test to the inter-domain path 64, two delay test circuits 10 are provided in the semiconductor integrated circuit shown in FIG. 11. It should be noted that the two delay test circuits 10 and signals related thereto are discriminated by symbols "A" and "B" added to the reference symbols in the following description.

The scan flip-flop 63A and the scan flip-flop 63B belong to different clock domains, and clock signals are supplied to the scan flip-flops 63A and 63B from different clock trees, respectively. Specifically, a clock system is constituted by the delay test circuit 10A, a selector 61A, and a first clock tree 62A and supplies a clock signal to the scan flip-flop 63A. A shift clock signal 72 is supplied to a first input of the selector 61A and an output clock signal $CLK_{OUT}^A$ outputted from the delay test circuit 10A is supplied to a second input thereof. The selector 61A selects one of the output clock signal $CLK_{OUT}^A$ outputted from the delay test circuit 10A and the shift clock signal 72 in response to a scan enable signal 71. The first clock tree 62A distributes the clock signal outputted from the selector 61A to a first clock domain including the scan flip-flop 63A. Likewise, another clock system is constituted by the delay test circuit 10B, a selector 61B, and a second clock tree 62B and supplies a clock signal to the scan flip-flop 63B. The shift clock signal 72 is supplied to a first input of the selector 61B and an output clock signal $CLK_{OUT}^B$ outputted from the delay test circuit 10B is supplied to a second input thereof. The selector 61B selects one of the output clock signal $CLK_{OUT}^B$ outputted from the delay test circuit 10B and the shift clock signal 72 in response to the scan enable signal 71. The second clock tree 62B distributes the clock signal outputted from the selector 61B to a second clock domain including the scan flip-flop 63B.

It is important to synchronize the delay test circuits 10A and 10B with each other in order to supply the clock signals to the scan flip-flops 63A and 63B at an appropriate timing. To synchronize the delay test circuits 10A and 10B with each other, it is desired first to synchronize a clock generation start signal 19A supplied to the delay test circuit 10A with a clock generation start signal 19B supplied to the delay test circuit 10B. More specifically, in the present embodiment, flip-flops 65A and 65B establish synchronization of the clock generation start signal 19A with the clock generation start signal 19B. A clock generation synchronization signal 73 is supplied to data inputs of the flip-flops 65A and 65B, and a test reference clock signal 74 is supplied to clock inputs thereof. The clock generation synchronization signal 73 is a control signal for instructing the delay test circuits 10A and 10B to output the clock signals. The test reference clock signal 74 is a clock signal generated by a PLL circuit (not shown) included in the semiconductor integrated circuit. As stated later, the test reference clock signal 74 is used in common to the delay test circuits 10A and 10B so that the circuits 10A and 10B generate the output clock signals $CLK_{OUT}^A$ and $CLK_{OUT}^B$, respectively. The flip-flops 65A and 65B latch the clock generation synchronization signal 73 in synchronization with a rising edge of the test reference clock signal 74. An output signal of the flip-flop 65A and an output signal of the flip-flop 65B are used as the clock generation start signal 19A supplied to the delay test circuit 10A and the clock generation start signal 19B supplied to the delay test circuit 10B, respectively. As a result, the clock generation start signals 19A and 19B are simultaneously activated in synchronization with activation of the clock generation synchronization signal 73.

To synchronize the delay test circuits 10A and 10B with each other, it is also desired to synchronize input PLL clock signals 20A and 20B supplied to the delay test circuits 10A and 10B with each other, respectively. In the present embodiment, the input PLL clock signal 20A is synchronized with the input PLL clock signal 20B by providing selectors 66A and 66B in the semiconductor integrated circuit and using the test reference clock signal 74 in common as the input PLL clock signals 20A and 20B. The selector 66A selects one of the test reference clock signal 74 and the first PLL clock signal 75A in response to an inter-domain test mode signal 76. The selector 66B selects one of the test reference clock signal 74 and the second PLL clock signal 75B in response to the inter-domain test mode signal 76. A clock signal outputted from the selector 66A is used as the input PLL clock signal 20A supplied to the delay test circuit 10A. A clock signal outputted from the selector 66B is used as the input PLL clock signal 20B supplied to the delay test circuit 10B. In a normal operation, the inter-domain test mode signal 76 is inactivated, i.e., set to "0" in the present embodiment, and the first PLL clock signal 75A and the second PLL clock signal 75B are supplied as the input PLL clock signals 20A and 20B, respectively. In addition, when normal mode signals 21A and 21B supplied to the delay test circuits 10A and 10B are activated, and the first PLL clock signal 75A and the second PLL clock signal 75B are supplied to the first clock domain and the second clock domain as they are, respectively. On the other hand, when the at-speed delay test is carried out to the inter-domain path 64, the inter-domain test mode signal 76 is activated, and the selectors 66A and 66B both select the test reference clock signal 74. In response to the selection, the test reference clock signal 74 is supplied in common to the delay test circuits 10A and 10B. The delay test circuits 10A and 10B use the test reference clock signal 74 as the inputs PLL clock signals 20A and 20B, respectively.

As the test reference clock signal 74, a clock signal having a waveform which makes it possible to simulate a data transfer through the inter-domain path 64 in the normal operation. In other words, a clock signal is used as the test reference clock signal 74 and plural times of a period of the clock signal is equal to a period from the time when a clock pulse is to be supplied to the clock input of the scan flip-flop 63A to the time when a clock pulse is to be supplied to the clock input of the scan flip-flop 63B during the test to the inter-domain path 64. For instance, as shown in FIGS. 12A to 12L, to test the inter-domain path 64, it is necessary to supply the clock pulses to the clock input of the scan flip-flop 63B at time of one clock period of the first PLL clock signal 75A after the clock pulse is supplied to the clock input of the scan flip-flop 63A. In this case, a clock signal equal in clock period to the first PLL clock signal 75A is used as the test reference clock signal 74. Also, the first PLL clock signal 75A itself may be used as the test reference clock signal 74.

The at-speed delay test to the inter-domain path 64 is carried out through the following procedure. First, an initialization pattern is set to the scan flip-flop 63A through the scan path (not shown), and a test pattern output pattern is set to the scan flip-flop (not shown) connected to an input of a combinational circuit (not shown) connected to an input of the scan flip-flop 63A. More specifically, the scan enable signal 71 is activated and the shift clock signal 72 is then supplied from the LSI tester. In synchronization with the shift clock signal 72, the initialization pattern and the test pattern output pattern are supplied from the LSI tester. In response to the supply, the initialization pattern and the test pattern output pattern are set to the corresponding scan flip-flops, respectively. By setting the initialization pattern to the scan flip-flop 63A, each node of the inter-domain path 64 is initialized. In addition, by setting the test pattern output pattern to the related scan flip-flop, a test pattern is set to the input of the scan flip-flop 63A. Upon completion of setting the initialization pattern and the test pattern output pattern, the scan enable signal 71 is inactivated.

Furthermore, the clock waveform setting data 14 is set to the delay test circuits 10A and 10B, respectively, and timing for outputting clock pulses to the delay test circuits 10 and 10B is set. The clock waveform setting data 14 set in the delay test circuits 10A and 10B is determined so that only one data bit of the data 14 is "1" and the other bits thereof are "0". A timing at which the delay test circuits 10A and 10B output clock pulses can be controlled by setting a desired data bit of the data bits $D_1$ to $D_4$ of the clock waveform setting data 14 to "1".

Next, the inter-domain test mode signal 76 and the clock generation synchronization signal 73 are activated, and the delay test circuits 10A and 10B start supplying clock pulses to the scan flip-flops 63A and 63B, respectively. In response to activation of the clock generation start signal 73, the clock generation start signals 19A and 19B are simultaneously activated and supplied to the respective delay test circuits 10A and 10B. In addition, the delay test circuits 10A and 10B output clock pulses at the timing designated based on the clock waveform setting data 14. Specifically, a clock pulse is supplied first to the clock input of the scan flip-flop 63A from the delay test circuit 10A. In response to the supply, the scan flip-flop 63A starts supplying the test pattern to the inter-domain path 64, and a desired state transition occurs in the inter-domain path 64. After a desired time, the clock pulse is supplied from the delay test circuit 10B to the clock input of the scan flip-flop 63B, and the scan flip-flop 63B latches data outputted from the inter-domain path 64. Thereafter, the data latched by the scan flip-flop 63B is transferred to the tester (not shown) through the scan path (not shown), and it is determined whether a data transfer on the inter-domain path 64 is correctly performed.

Values of the clock waveform setting data 14 set in the respective delay test circuits 10A and 10B are determined to compensate for a difference in delay time between the first clock tree 62A and the second clock tree 62B. A case where a clock pulse is supplied to the clock input of the scan flip-flop 63B at the time of one clock period of the test reference clock signal 74 after the clock pulse is supplied to the clock input of the scan flip-flop 63A so as to test the inter-domain path 64 will now be discussed.

Figure 12:
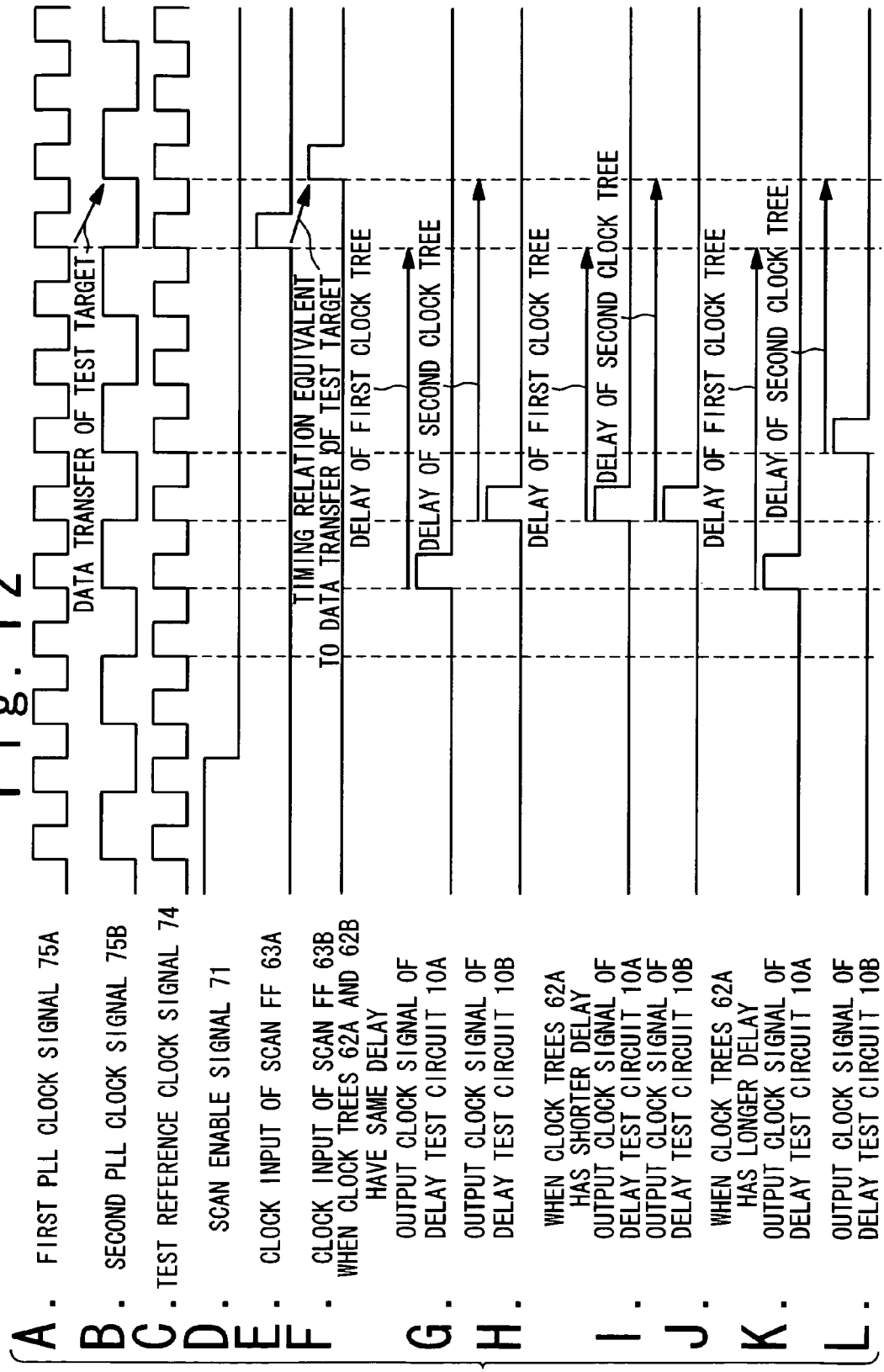
FIGS. 12A to 12L are timing charts of an operation of the semiconductor integrated circuit shown in FIG. 11.

In case of FIGS. 12G and 12H, if the first clock tree 62A and the second clock tree 62B are equal in delay time, the clock waveform setting data 14 is determined so that the delay test circuit 10B outputs a clock pulse at a delayed timing from that of the delay test circuit 10A by one clock period of the test reference clock signal 74 and is set to the respective delay test circuits 10A and 10B. For instance, "0100" is set to the delay test circuit 10A as the clock waveform setting data 14 and "0010" is set to the delay test circuit 10B as the clock waveform setting data 14. FIGS. 12G and 12H show operations of the delay test circuits 10A and 10B. As a result, the clock pulses are supplied to the clock inputs of the scan flip-flops 63A and 66B at the desired times.

In case of FIGS. 12I and 12J, if the delay time of the first clock tree 62A is shorter than that of the second clock tree 62B by one clock period of the test reference clock signal 74, the clock waveform setting data 14 is determined so that the delay test circuits 10A and 10B simultaneously output clock pulses and is set to the respective delay test circuits 10A and 10B. For instance, "0010" is set to the delay test circuits 10A and 10B as the clock waveform setting data 14. FIGS. 12I and 12J show operations of the delay test circuits 10A and 10B. As a result, the clock pulses are supplied to the clock inputs of the scan flip-flops 63A and 66B at the desired times.

Conversely, in case of FIGS. 12K and 12L, if the delay time of the first clock tree 62A is longer than that of the second clock tree 62B by one clock period of the test reference clock signal 74, the clock waveform setting data 14 is determined so that the delay test circuit 10B outputs a clock pulse at a delayed timing from that of the delay test circuit 10A by as much as two clock periods of the test reference clock signal 74 and is set to the respective delay test circuits 10A and 10B. For instance, "0100" is set to the delay test circuit 10A as the clock waveform setting data 14 and "0001" is set to the delay test circuit 10B as the clock waveform setting data 14. FIGS. 12K and 12L show operations of the delay test circuits 10A and 10B. As a result, the clock pulses are supplied to the clock inputs of the scan flip-flops 63A and 63B at the desired times.

As stated above, the semiconductor integrated circuit shown in FIG. 11 and including the delay test circuits 10A and 10B can generate clock pulses at the desired timings. The semiconductor integrated circuit can execute the at-speed delay test to the inter-domain path 64.

[First Modification]

In the semiconductor integrated circuit shown in FIG. 11, if the difference in delay time between the first clock tree 62A and the second clock tree 62B is great, it is necessary to increase the difference between output timings of clock pulses outputted from the delay test circuits 10A and 10B. An upper limit of the difference between the output timings of the clock pulses depends on the number of bits of the clock waveform setting data 14 settable to the delay test circuits 10A and 10B. For instance, if the number of bits of the clock waveform setting data 14 is four, the difference in delay time between the first clock tree 62A and the second clock tree 62B is allowed up to three clock periods of the test reference clock signal 74.

The simplest method for increasing the difference between output timings at which the delay tests 10A and 10B output the clock pulses is to increase the number of bits of the clock waveform setting data 14 supplied to at least one of the delay test circuits 10A and 10B. If the number of bits of the clock waveform setting data 14 is increased, an adjustment range of the output timings of the clock pulses can be made wide. Accordingly, even if the difference in delay between the first clock tree 62A and the second clock tree 62B is great, the clock pulse output timing can be appropriately adjusted.

However, if a plurality of delay test circuits 10 are incorporated into the semiconductor integrated circuit, it is not preferable to increase the number of bits of the clock waveform setting data 14 supplied to a specific one of the delay test circuits 10 in light of easiness of layout. This needs change of the configuration of the specific delay test circuit 10. Specifically, it is necessary to increase the number of bits held in the clock waveform holding register 11 and the clock waveform register 12 in the delay test circuit 10 according to the number of bits of the clock waveform setting data 14. As a result, it would become necessary to design only the specific delay test circuit 10 separately. It is not preferable to incorporate the delay test circuits 10 into the semiconductor integrated circuits as hard macros.

Figure 13:
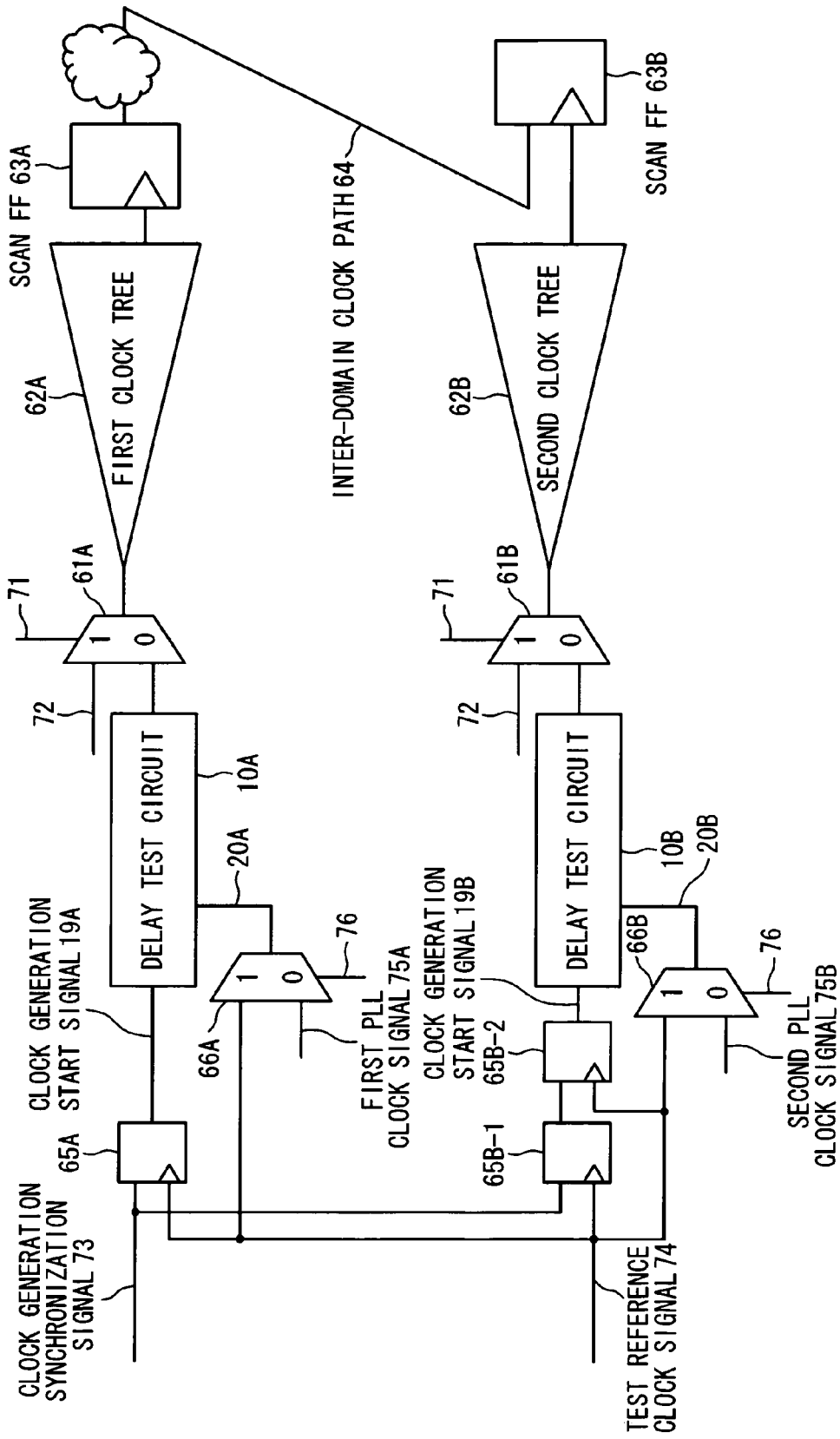
FIG. 13 is a block diagram of another configuration of a semiconductor integrated circuit configured to be able to test the inter-domain path by using the two delay test circuits shown in FIG. 3.

FIG. 13 is a block diagram of a configuration of a semiconductor integrated circuit so as to increase the difference between output timings of the clock pulses outputted from the delay test circuits 10A and 10B without increasing the number of bits of the clock waveform setting data 14 that can be held in the delay test circuits 10A and 10B. In the semiconductor integrated circuit shown in FIG. 13, a difference is given to a delay time from the time when the clock generation synchronization signal 73 is activated to the time when the clock generation start signals 19A and 19B supplied to the respective delay test circuits 10A and 10B are activated. Thus, a maximum delay of the clock pulse output timing is increased. More specifically, in the semiconductor integrated circuit shown in FIG. 13, different numbers of flip-flops are used to generate the clock generation start signals 19A and 19B from the clock generation synchronization signal 73. In the configuration shown in FIG. 13, the clock generation start signal 19A is generated by the single flip-flop 65A whereas the clock generation start signal 19B is generated by two flip-flops 65B-1 and 65B-2 connected in series.

By employing this configuration, in the semiconductor integrated circuit shown in FIG. 13, the maximum delay between clock pulse output timings of the delay test circuits 10A and 10B is increased by one clock period of the test reference clock signal 74, compared with that for the semiconductor integrated circuit shown in FIG. 11. Specifically, the maximum delay in clock pulse output timing between the delay test circuits 10A and 10B of the semiconductor integrated circuit shown in FIG. 11 is three clock periods whereas the maximum delay for the semiconductor integrated circuit shown in FIG. 13 is four clock periods. As could be understood, in the semiconductor integrated circuit shown in FIG. 13, the clock pulse output timings can be optimally adjusted even if the difference in delay is great between the first clock tree 62A and the second clock tree 62B without increasing the number of data bits of the clock waveform setting data 14 held in the delay test circuits 10A and 10B.

FIGS. 14A to 14K are timing charts of an operation of the semiconductor integrated circuit shown in FIG. 13. In the operation shown in FIGS. 14A to 14K, it is assumed that the delay time of the first clock tree 62A is longer than that of the second clock tree 62B by three clock periods of the test reference clock signal 74. It is also assumed that it is necessary to supply a clock pulse to the clock input of the scan flip-flop 63B at the time of one clock period of the test reference clock signal 74 after the clock pulse is supplied to the clock input of the scan flip-flop 63A so as to test the inter-domain path 64. To satisfy the requirements, "1000" is set as the clock waveform setting data 14 to the delay test circuit 10A and "0001" is set as the clock waveform setting data 14 to the delay test circuit 10B.

When the clock generation synchronization signal 73 is activated, e.g., changes from "0" to "1" in this embodiment, after the clock waveform setting data 14 is set, the clock generation start signals 19A and 19B are sequentially activated in synchronization with a rising edge of the test reference clock signal 74. The time when the clock generation start signal 19B supplied to the delay test circuit 10B is activated is one clock period after the clock generation start signal 9A supplied to the delay test circuit 10A is activated. The delay test circuit 10A outputs a clock pulse in the first clock period after activation of the clock generation start signal 19A. The delay test circuit 10A outputs a clock pulse in the fourth clock period after activation of the clock generation start signal 19B, i.e., in the fifth clock period after activation of the clock generation start signal 19A. Therefore, the time when the delay test circuit 10B outputs the clock pulse is delayed from the time when the delay test circuit 10A outputs the clock pulse by as much as four clock periods of the test reference clock signal 74. As a result, the clock pulses are supplied to the respective clock inputs of the scan flip-flops 63A and 63B at desired times.

The number of flip-flops used to generate the clock generation start signal 19B is determined based on the difference between output timings of the clock pulses outputted from the delay test circuits 10A and 10B to compensate for the difference in delay between the first clock tree 62A and the second clock tree 62B. For instance, it is sufficient to use three flip-flops connected in series to generate the clock generation start signal 19B so as to delay the time when the delay test circuit 10B outputs a clock pulse from the time when the delay test circuit 10A outputs a clock pulse by as much as five clock periods of the test reference clock signal.

[Second Modification]

As evident from the operations of the delay test circuits 10 described above, in the semiconductor integrated circuit shown in FIG. 11, the timings at which the delay test circuits 10A and 10B output the clock pulses are adjusted in units of clock periods of the test reference clock signal 74. However, the difference in delay between the first clock tree 62A and the second clock tree 62B is not always in units of clock periods. It is, therefore, preferable to be able to adjust the timings at which the delay test circuits 10A and 10B output the clock pulses more minutely.

FIG. 15 is a circuit diagram of a configuration of a semiconductor integrated circuit for making it possible to adjust the timings at which the delay test circuits 10A and 10B output the clock pulses more minutely. In the configuration of FIG. 15, one of the input PLL clock signal 20A supplied to the delay test circuit 10A and the input PLL clock signal 20B supplied to the delay test circuit 10B is inverted, if necessary. For instance, to invert the input PLL clock signal 20B is equivalent to delay the input PLL clock signal 20B by a half of clock period. Thus, the timing at which the delay test circuit 10B outputs a clock pulse is delayed by the half clock period by inverting the input PLL clock signal 20B. Likewise, by inverting the input PLL clock signal 20A, the timing at which the delay test circuit 10A outputs a clock pulse can be delayed by the half clock period. More specifically, to invert a desired one of the input PLL clocks 20A and 20B, the semiconductor integrated circuit shown in FIG. 15 includes a selector 67A provided on a path on which the input PLL clock signal 20A is supplied to the delay test circuit 10A, and a selector 67B provided on a path on which the input PLL clock signal 20B is supplied to the delay test circuit 10B.

The selector 67A includes an inverted input and a non-inverted input, both of which are connected to an output of the selector 66A that selects one of the test reference clock signal 74 and the first PLL clock signal 75A. A first clock inversion control signal 77A is supplied to a control input of the selector 67A, and the selector 67A selects one of the inverted input and the non-inverted input in response to the first clock inversion control signal 77A. Specifically, if the first clock inversion control signal 77A is activated, i.e., set to "1" in the present embodiment, the selector 67A selects the inverted input. That is, the selector 67A inverts the clock signal outputted from the selector 66A, and outputs the inverted clock signal. If the first clock inversion control signal 77A is inactivated, i.e., set to "0" in the present embodiment, the selector 67A selects the non-inverted input and outputs the clock signal outputted from the selector 66A as it is. The clock signal outputted from the selector 67A is used as the input PLL clock signal 20A. Also, the selector 67B includes the same functions as those of the selector 67A. The selector 67B includes an inverted input and a non-inverted input, both of which are connected to an output of the selector 66B that selects one of the test reference clock signal 74 and the second PLL clock signal 75B. A second clock inversion control signal 77B is supplied to a control input of the selector 67B, and the selector 67B selects one of the inverted input and the non-inverted input in response to the second clock inversion control signal 77B. If the second clock inversion control signal 77B is activated, the selector 67B selects the inverted input. Thus, the selector 67B inverts the clock signal outputted from the selector 66B, and outputs the inverted clock signal. If the first clock inversion control signal 77A is inactivated, the selector 67B selects the non-inverted input and outputs the clock signal outputted from the selector 66B as it is.

As could be understood, in the semiconductor integrated circuit shown in FIG. 15, one of the input PLL clock signals 20A and 20B can be inverted if necessary. Thus, the timing at which the clock pulse is outputted can be adjusted in units of half-clock periods.

FIGS. 16A to 16N are timing charts of an operation of the semiconductor integrated circuit shown in FIG. 15 when the clock pulse output timing is adjusted in units of half-clock periods. In the operation of FIGS. 16A to 16N, it is assumed that it is necessary to supply a clock pulse to the clock input of the scan flip-flop 63B at the time of one clock period of the test reference clock signal 74 after a clock pulse is supplied to the clock input of the scan flip-flop 63A so as to test the inter-domain path 64. As shown in FIGS. 16K and 16L, if the delay time of the first clock tree 62A is shorter than that of the second clock tree 62B by a half clock period of the test reference clock signal 74, the second clock inversion control signal 77B is activated, i.e., set to "1" in the present embodiment. In addition, the clock waveform setting data 14 equal in value is set to the delay test circuits 10A and 10B, respectively. For instance, "0010" is set as the clock waveform setting data 14 to both the delay test circuits 10A and 10B. FIGS. 16K and 16L show operations of the delay test circuits 10A and 10B in this case. Thus, the delay test circuit 10B outputs a clock pulse at a delayed timing from that of the delay test circuit 10A by a half clock period. The clock pulses are thereby supplied to the respective scan flip-flops 63A and 63B at desired times.

As shown in FIGS. 16M and 16N, if the delay time of the first clock tree 62A is longer than that of the second clock tree 62B by a half clock period of the test reference clock signal 74, the second inversion control signal 77B is activated, and the clock waveform setting data 14 that satisfies the following conditions is set to the respective delay test circuits 10A and 10B.

A data bit $D_i$ (where i is a number equal to or greater than 1 and equal to or smaller than 3) of the clock waveform setting data 14 set to the delay test circuit 10A, and a data bit $D_{i+1}$, of the clock waveform setting data 14 set to the delay test circuit 10B are both "1" and the other data bits are all "0". For instance, "0100" is set as the clock waveform setting data 14 to the delay test circuit 10A, and "0010" is set as the clock waveform setting data 14 to the delay test circuit 10B. FIGS. 16M and 16N show the operations of the delay test circuits 10A and 10B in this case. As a result, the clock pulses are supplied to the clock inputs of the respective scan flip-flops 63A and 63B at a desired timing.

As stated above, with the configuration of the semiconductor integrated circuit shown in FIG. 15, the timing at which the clock pulse is outputted can be adjusted in units of half-clock periods.

What is claimed is:

1. A semiconductor integrated circuit comprising:
a first input side flip-flop;
a first combinational circuit having an input connected with said first input side flip-flop;
an output side flip-flop connected with an output of said first combinational circuit;
a second input side flip-flop;
a second combinational circuit having an input connected with said second input side flip-flop and an output connected with said first input side flip-flop; and
a delay test circuit,
wherein said delay test circuit generates output clock pulses by removing an optional one from equal to or more than 3 continuing clock pulses of an input clock signal, and supplies said output clock pulses to said first input side flip-flop, said output side flip-flop and said second input side flip-flop;
wherein:
said first combinational circuit is a multi-cycle path and receives a first input data from said first input side flip-flop to output a first output data indicating an operation result of said first input data to said output side flip-flop;
said second combinational circuit is a single-cycle path and receives a second input data from said second input side flip-flop to output a second output data indicating an operation result of said second input data to said first input side flip-flop;
said first input side flip-flop and said second input side flip-flop output said first input data and said second input data to said first and second combinational circuits, respectively, in response to an edge of a first one of said output clock pulses;
said output side flip-flop and said first input side flip-flop simultaneously receive said first output data and said second output data therefrom, respectively, in response to an edge of a second one of said output clock pulses; and
a time interval between said edge of said first one of output clock pulses and said edge of said second one of output clock pulses corresponds to a first combinational circuit data transfer.

2. The semiconductor integrated circuit according to claim 1, wherein said delay test circuit comprises:
a clock waveform setting register configured to receive and hold a clock waveform setting data indicating a waveform of a clock signal; and
an output section configured to generate said output clock pulses by masking said input clock signal in response to said clock waveform setting data held by said clock waveform setting register.

3. The semiconductor integrated circuit according to claim 2, wherein said output section comprises:
a shift register configured to receive data bits of said clock waveform setting data from said clock waveform setting register, and sequentially output said data bits in synchronization with said input clock signal; and
a clock gating circuit configured to generate said output clock signal by masking a said input clock signal in response to said data bits outputted from said shift register.

4. The semiconductor integrated circuit according to claim 1, wherein:
a first flip-flop as said first input side flip-flop belongs to a first clock domain;
a second flip-flop as said output side flip-flop belongs to a second clock domain, and has an input connected with an output of said first flip-flop through an inter-domain path;
a first delay test circuit as said delay test circuit that is configured to output clock pulses by removing an optional one from equal to or more than 3 continuing clock pulses of a first input clock signal, comprising a first clock waveform setting register configured to receive and hold a first clock waveform setting data indicating a first waveform of a first clock signal, supplies a first clock pulse to said first flip-flop through a first clock tree;
said semiconductor integrated circuit further comprises a second delay test circuit that is configured to output clock pulses by removing an optional one from equal to or more than 3 continuing clock pulses of a second input clock signal, wherein the second delay test circuit comprises a first clock waveform setting register configured to receive and hold a second clock waveform setting data indicating a first waveform of a first clock signal, and wherein the second delay test circuit is configured to supply a second clock pulse to said second flip-flop through a second clock tree; and
at least one of a first output timing at which said first delay test circuit outputs said first clock pulse, and a second output timing at which said second delay test circuit outputs said second clock pulse is adjustable.

5. The semiconductor integrated circuit according to claim 4, further comprising:
a first clock supplying section configured to generate said first input clock signal from a test reference clock signal and supply said first input clock signal to said first delay test circuit; and
a second clock supplying section configured to generate said second input clock signal from said test reference clock signal and to supply said second input clock signal to said second delay test circuit.

6. The semiconductor integrated circuit according to claim 5, wherein said first clock supplying section selects said test reference clock signal and a clock signal obtained by inverting said test reference clock signal and supplies the selected clock signal to said first delay test circuit as said first input clock signal.

7. The semiconductor integrated circuit according to claim 5, wherein:
said second clock supplying section selects one of said test reference clock signal and a clock signal obtained by inverting said test reference clock signal and supplies the selected clock signal to said second delay test circuit as said second input clock signal.

8. The semiconductor integrated circuit according to claim 4, further comprising:
a first clock generation start signal generation circuit configured to generate a first clock generation start signal in response to a clock generation synchronization signal and supply said first clock generation start signal to said first delay test circuit; and
a second clock generation start signal generation circuit configured to generate a second clock generation start signal in response to said clock generation synchronization signal and supply said second clock generation start signal to said second delay test circuit,
wherein:
said first delay test circuit generates said first clock pulse to have a waveform corresponding to said first clock waveform setting data;
said second delay test circuit generates said second clock pulse to have a waveform corresponding to said second clock waveform setting data;
said first delay test circuit starts generation of said first clock pulse in response to activation of said first clock generation start signal;
said second delay test circuit starts generation of said second clock pulse in response to the activation of said second clock generation start signal; and
a delay time from the activation of said clock generation synchronization signal to the activation of said first clock generation start signal is different from a delay time from the activation of said clock generation sync signal to the activation of said second clock generation start signal.

9. The semiconductor integrated circuit according to claim 1, wherein the delay test circuit comprising:
a clock waveform setting register configured to input and hold a clock waveform setting data indicating a waveform of a clock signal; and
a clock gating circuit configured to generate an output clock signal as a pulse signal in which an optional pulse is removed from equal to or more than 3 continuing clock pulses of the input clock signal in response to said clock waveform setting data.

10. The semiconductor integrated circuit according to claim 9, the delay test circuit further comprising:
a shift register configured to receive data bits of said clock waveform setting data from said clock waveform setting register, and sequentially output said data bits in synchronization with said input clock signal,
wherein said clock gating circuit generates said output clock signal by masking a part of a pulse string of said input clock signal in response to said data bits outputted from said shift register.

11. A semiconductor integrated circuit comprising;
a first flip-flop outputting a first input data in response to a first edge of a clock signal;
a first combinational circuit coupled to said first flip-flop and receiving said first input data therefrom to output a first output data indicating an operation result of said first input data, wherein said first combination circuit is a single-cycle path;
a second flip-flop coupled to said first combinational circuit to receive said first output data in response to a second edge of said clock signal, said second edge being subsequent to said first edge, wherein said second flip-flop outputs a second input data in response to said first edge of said clock signal;
a second combinational circuit coupled to said second flip-flop and receiving said second input data therefrom to output a second output data indicating an operation result of said second input data, wherein said second combinational circuit is a multi-cycle path;
a third flip-flop coupled to said second combinational circuit to receive said second output data in response to said second edge of said clock signal; and
a delay test circuit coupled to said first, second and third flip-flops respectively to supply said clock signal thereto, wherein a time interval between said first edge of said clock signal and said second edge of said clock signal corresponds to a second combinational circuit data transfer,
wherein said second and third flip-flops simultaneously receive said first and second output data respectively in response to said second edge of said clock signal.

12. The semiconductor integrated circuit according to claim 11, wherein said first, second, and third flip-flops are included in a scan path for checking operations of said first and second combinational circuit.

* * * * *